United States Patent
Kitatochi et al.

(10) Patent No.: US 6,741,627 B2
(45) Date of Patent: May 25, 2004

(54) PHOTOLITHOGRAPHIC MOLECULAR FLUORINE LASER SYSTEM

(75) Inventors: Naoki Kitatochi, Tokyo (JP); Tatsuya Ariga, Kanagawa (JP); Osamu Wakabayashi, Kanagawa (JP)

(73) Assignees: Ushio Denki Kabushiki Kaisya, Tokyo (JP); Gigaphoton Inc., Tokyo (JP)

( * ) Notice: Subject to any disclaimer, the term of this patent is extended or adjusted under 35 U.S.C. 154(b) by 16 days.

(21) Appl. No.: 10/330,966

(22) Filed: Dec. 27, 2002

(65) Prior Publication Data

US 2003/0161373 A1 Aug. 28, 2003

(30) Foreign Application Priority Data

Dec. 28, 2001 (JP) ........................................ 2001-398815

(51) Int. Cl.[7] ................................................ H01S 3/22
(52) U.S. Cl. .............................. 372/57; 375/20; 375/32
(58) Field of Search ................................ 372/57, 20, 32

(56) References Cited

U.S. PATENT DOCUMENTS

| | | | |
|---|---|---|---|
| 4,881,231 A | * | 11/1989 | Jain ............................ 372/32 |
| 6,590,922 B2 | * | 7/2003 | Onkels et al. ................. 372/57 |
| 2002/0021729 A1 | * | 2/2002 | Vogler .......................... 372/55 |
| 2002/0186739 A1 | * | 12/2002 | Sandstrom et al. ............ 372/55 |
| 2003/0016438 A1 | * | 1/2003 | Islam ........................... 359/334 |
| 2003/0035202 A1 | * | 2/2003 | Islam et al. ................... 359/334 |
| 2003/0053507 A1 | * | 3/2003 | Islam et al. .................... 372/69 |
| 2003/0161373 A1 | * | 8/2003 | Kitatochi et al. ............. 372/55 |

* cited by examiner

*Primary Examiner*—Leon Scott, Jr.
(74) *Attorney, Agent, or Firm*—Dellett & Walters

(57) ABSTRACT

The invention provides a two-stage laser mode of photolithographic molecular fluorine laser system for matching the center wavelength of an oscillation-stage laser to the center wavelength of an amplification-stage laser, thereby oscillating a laser beam having a low spectral purity and a narrow linewidth. The laser system is of the two-stage mode comprising an oscillation-stage laser 10 and an amplification-stage mode 20. The center wavelength of a laser beam emitted out of the oscillation-stage laser 10 is compared with and substantially matched to the center wavelength of a laser beam emitted out of the amplification-stage laser 20 when the latter is oscillated by itself.

14 Claims, 13 Drawing Sheets

PHOTOLITHOGRAPHIC MOLECULAR FLUORINE LASER SYSTEM

BACKGROUND OF THE INVENTION

The present invention relates generally to a photolithographic molecular fluorine laser system, and more particularly to a two-stage laser mode of photolithographic molecular fluorine laser system in which the center wavelength of an oscillation-stage laser is matched to the center wavelength of an amplification-stage laser.

For photolithographic technologies to achieve on semiconductors a semiconductor integrated circuit having a marking width of 70 nm or less, there are demanded exposure light sources of wavelengths of 160 nm or less. $F_2$ (molecular fluorine) laser systems that give out ultraviolet rays of wavelengths of around 157 nm are now thought of as a promising candidate for those light sources.

As shown in FIG. 16, a typical $F_2$ laser system has two primary oscillation wavelengths ($\lambda_1$=157.6299 nm and $\lambda_2$=157.5233 nm: Sov. J. Quantum Eelectron. 16(5), May 1986), with its spectral linewidth (FWHM: full width at half maximum) being of the order of about 1 pm. The intensity ratio of two such oscillation lines is $I(\lambda_1)/I(\lambda_2) \approx 78$. For exposure purposes, usually, the oscillation line of wavelength $\lambda_1$(=157.6299 nm) having stronger intensity is used.

By the way, the semiconductor photolithography technology is roughly broken down into the following two types that use:

1) a dioptric system, and
2) a catadioptric system.

The use of the catadioptric system for photolithography ensures that chromatic aberrations are reduced. For this reason, an aligner using such a catadioptric system holds great promising in a wavelength range of the order of current 157 nm. However, the catadioptric systems are more troublesome than conventional dioptric systems in terms of the optical axis alignment of an aligner.

On the other hand, the dioptric system is a projection optical system generally used on heretofore known semiconductor aligners. One grave problem with the semiconductor photolithographiy technology is how to correct an optical system for chromatic aberrations. In the dioptric system, correction of chromatic aberrations has been achieved by some combinations of optical elements such as lenses having varying refractive indices Because of considerable restrictions on the types of possible optical materials that are transparent to a wavelength range in the vicinity of 157 nm, however, there is still no option but to use $CaF_2$.

Thus, some line-narrowing means is needed for $F_2$ laser systems used as a light source for the dioptric type aligners. For instance, the spectral full width at half maximum of a laser beam should be narrowed to 0.3 pm or less.

On the other hand, the average output necessary for an $F_2$ laser used as a photolithographic light source, for instance, is 20 W. To put it another way, when the repetitive frequency of the $F_2$ laser is 2 kHz, a pulse energy per pulse is 10 mJ, and at the repetitive frequency of 4 kHz, a pulse energy per pulse is 5 mJ.

However, when one wishes to obtain laser outputs of 5 to 10 mJ while, for instance, a coated etalon is located as line-narrowing means in a laser resonator, the coating of the etalon is damaged; there is no option but to use an etalon without any coating thereon. Accordingly, it is still impossible to make spectral linewidths narrow. In addition, only linewidths of 0.4 to 0.6 pm are merely obtained at best because of the presence of much ASE (amplified spontaneous emission) component. Thus, it is still difficult to achieve any narrow band at pulse energies of 5 to 10 mJ.

Situations being like this, for instance, it is reasonalbe to rely on a two-stage laser system comprising an oscillation-stage laser and an amplification-stage laser for the purpose of obtaining laser beams having spectral linewidths of 0.3 pm or less and pulse energies of 5 mJ or greater. To be specific, the oscillation-stage laser gives out a laser beam that has low outputs yet spectral linewidths of 0.3 pm or less. Then, this laser beam is amplified at the amplification-stage laser to obtain a laser beam that has spectral linewidths of 0.3 pm or less and pulse energies of 5 mJ or greater.

A typical two-stage laser system operates in two modes, the injection locking mode and the master oscillator power amplifier (MOPA) mode. In the injection locking mode, the amplification-stage laser is provided with a laser resonator for which an unstable resonator is used. In the MOPA mode, no laser resonator is used. In the MOPA mode where no laser resonator is provided to the amplification-stage laser, the amplification-stage laser functions as a one-pass amplifier for a laser beam coming from the oscillation-stage laser.

For a line-narrowing element for the oscillation-stage laser, some combinations of one or more combined beam expansion and dispersion prism groups with gratings, a combination of an etalon with a total reflecting mirror, or the like are used. In what follows,-exemplary constructions of two-stage laser systems operating in the injection lock and the MOPA modes are explained.

FIG. 17(a) is illustrative of the injection locking mode where a prism and a diffraction grating are used as line-narrowing element and FIG. 17(b) again of the injection locking mode where an etalon is used as a line-narrowing element. FIG. 18(a) is illustrative of the MOPA mode where a prism and a diffraction grating are used as line-narrowing element and FIG. 18(b) again of the MOPA mode where an etalon is used as a line-narrowing element. Throughout FIGS. 17(a) to 18(b), reference numeral 10 represents an oscillation-stage laser, 20 an amplification-stage laser, 1 a laser chamber in the oscillation-stage laser 10, 1' a laser chamber in the amplification-stage laser 20, 2 a line-narrowing module (line-narrowing element), 3 an output mirror in the oscillation-stage laser 10, 4 an aperture for limiting a laser beam in the oscillation-stage laser 10, 5 a diffraction grating that forms a part of the line-narrowing module 2, 6 a combined beam expansion and dispersion prism that forms a part of the line-narrowing module 2, 7 a concave mirror that forms a part of an unstable resonator in the amplification-stage laser 20, 8 a convex mirror that forms a part of the unstable resonator in the amplification-stage laser 20, 9 a reflecting mirror interposed between the oscillation-stage laser 10 and an amplification-stage laser 20, 11 an etalon that forms a part of the line-narrowing module 2, and 12 a total reflecting mirror that forms a part of the line-narrowing module 2.

Specific reference is here made to the injection locking mode of FIG. 17(a), wherein the prism 6 and diffraction grating 5 are used as the line-narrowing element 2. The oscillation-stage laser 10 has a function of giving out a seed laser (seed laser light) for the laser system, and the amplification-stage laser 20 has a function of amplifying that seed laser. Namely, the overall spectral characteristics of the laser system are determined by the spectral characteristics of the oscillation-stage laser 10. Then, laser outputs (energy or power) from the laser system are determined by the amplification-stage laser 20. The oscillation-stage laser 10 comprises the line-narrowing module 2 including the expanding prism 6 and diffraction grating 5, so that laser beams having narrowed spectra linewidths are produced from the oscillation-stage laser 10.

It is here noted that the line-narrowing module 2 may be made up of the etalon 11 and total reflecting mirror 12, as shown in FIGS. 17(b) and 18(b).

The laser beam (seed laser beam) from the oscillation-stage laser 10 is guided to and poured into the amplification-stage laser 20 via a laser propagating system including the reflecting mirror 9 or the like. In the injection locking mode (FIG. 17), the amplification-stage laser is built up of the concave mirror 7 and convex mirror 8 so that the laser can be amplified even at a small input. For instance, an unstable resonator having a magnification of 3 or greater is used to this end.

There is a hole in the concave mirror 7 that forms a part of the unstable resonator in the amplification-stage laser 10, so that the seed laser beam introduced through that hole is reflected and expanded at the convex mirror 8 as shown by an arrow. Then, the reflected and expanded laser beam passes effectively through a discharging section in the laser chamber 1', so that the power of the laser beam increases. Then, the laser emerges from the convex mirror 8. The concave mirror 7 is provided in its center with a spatial hole and on the rest with a mirror coating having high reflectivity. The convex mirror 8 is provided at its center with a high-reflectivity mirror coating and with an antireflection coating at a portion around that center, from which the laser beam is to emerge. For the concave mirror 7, it is acceptable to use a mirror substrate having a spatial hole which alone is provided with an antireflection coating. It is also acceptable to use an unstable resonator comprising a mirror free from a transmitting portion.

A molecular fluorine laser uses helium and/or neon gases as buffer gases for both the oscillation-stage laser 10 and the amplification-stage laser 20. Whenever necessary, xenon may be used in combination.

FIG. 19 is illustrative in schematic of the laser pulse waveform vs. change-with-time of spectral linewidth relationships in a two-stage laser mode of $F_2$ laser system. In FIG. 19, t as abscissa is indicative of time, I as ordinate of intensity, and $\Delta\lambda$ of a spectral linewidth. As can be seen from the pulse waveform of FIG. 19, the spectral linewidth becomes slender with the lapse of time (i.e., as the number of round trips in the resonator increases). In a conventional band-narrowing laser, the spectral linewidth takes the form of an integral value. In the two-stage laser mode, however, it is possible to extract the latter part of a pulse, whose linewidth becomes instantaneously narrow, and amplifying only the output while that linewidth is kept, thereby reducing the ASE component.

By use of such a two-stage laser mode, it is thus possible to achieve high outputs simultaneously with very narrow bands.

When $F_2$ laser systems are used as photolithographic light sources, the spectral purity is critical. The term "spectral purity" is one index to the degree of concentration of spectral energy, referring to a linewidth that includes a "certain area ratio" in a spectral waveform. For instance, the "95% purity" commonly used in the art refers to a linewidth that accounts for a 95% area of the total area of a spectral waveform, as measured from the center side as shown in FIG. 20.

Referring specifically to an $F_2$ laser system, the center wavelength differs between upon buffered with helium and upon buffered with neon; for instance, when an oscillation-stage laser using a neon buffer and an amplification-stage laser using a helium buffer are immediately oscillated, they will be synchronized with the center wavelength of the oscillation-stage laser in misalignment with that of the amplification-stage laser, as shown in FIG. 21(a). Because, by definition, the $F_2$ laser is narrower in linewidth than ArF or KrF excimer lasers, this center wavelength misalignment will lead directly to deterioration in the spectral purity of a laser beam after amplification, as shown in FIG. 21(b).

SUMMARY OF THE INVENTION

In view of such situations as mentioned above, an primary object of the invention is to provide a photolithographic molecular fluorine laser system operating in a two-stage laser mode, wherein the center wavelength of an oscillation-stage laser is matched to that of an amplification-stage laser, thereby oscillating a laser beam having a low spectral purity and a narrow linewidth.

According to the present invention, this object is achievable by the provision of a photolithographic molecular fluorine laser system that comprises an oscillation-stage laser and an amplification-stage laser and operates in a two-stage mode, wherein:

the center wavelength of a laser beam emitted out of the oscillation-stage laser is compared with and substantially matched to the center wavelength of a laser beam emitted out of the amplification-stage laser when said amplification-stage laser is oscillated by itself.

According to the invention, the center wavelength of a laser beam emitted out of the oscillation-stage laser is compared with and substantially matched to that of a laser beam emitted out of the amplification-stage laser when the amplification-stage laser is oscillated by itself. It is thus possible to make the band of the photolithographic molecular fluorine laser system very narrow while the spectral purity is satisfactory.

Referring here to the "center wavelength" of the laser beam emitted out of the amplification-stage laser when oscillated independently, this term means, in the case of the injection locking mode, literally the center wavelength of the laser beam emitted out the amplification-stage laser when oscillated independently and, in the case of the MOPA mode, the wavelength that is found in the vicinity of any one of primary wavelengths emitted out of the amplification-stage laser and has the highest gain (see FIG. 16).

Still other objects and advantages of the invention will be in part be obvious and will in part be apparent from the specification.

The invention accordingly comprises the features of construction, combinations of elements, and arrangement of parts which sill be exemplified in the construction hereinafter set forth, and the scope of the invention will be indicated in the claims.

DESCRIPTION OF THE PREFERRED EMBODIMENTS

In what follows, the photolithographic molecular fluorine laser system of the present invention will be explained with reference to some embodiments.

Figure 1:
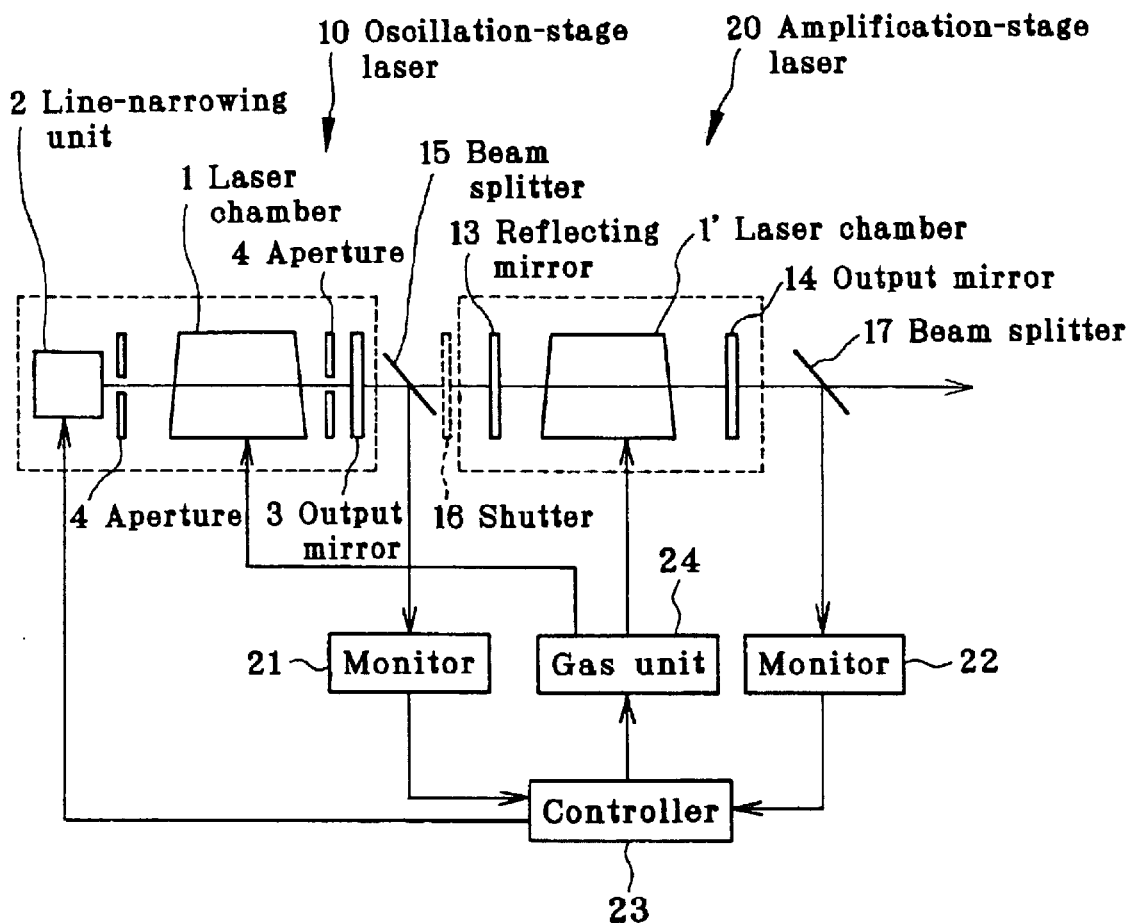
FIG. 1 is a system block diagram illustrative of one embodiment of the photolithographic molecular fluorine laser system according to the invention.

FIG. 1 is a system block diagram illustrative of the arrangement of one embodiment of the photolithographic molecular fluorine laser system to which the injection locking mode is applied.

Before explaining the arrangement and action of FIG. 1, an account is given to the causes of why the center wavelength of an oscillation-stage laser 10 is in misalignment with that of an amplification-stage laser 20.

The center wavelength misalignment is caused for the following reasons.

Figure 2:
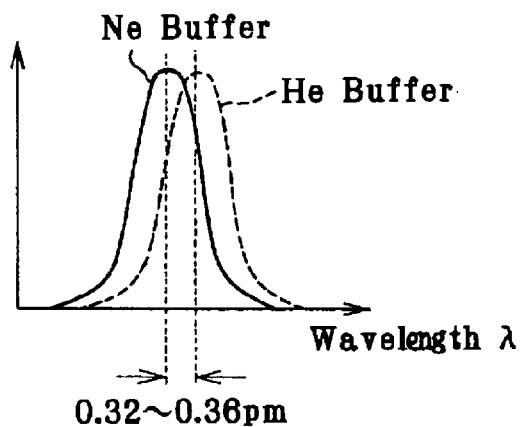
FIG. 2 is a vector diagram for a molecular fluorine laser system, showing that there is a center wavelength misalignment between when helium is used as a buffer gas and when neon is used as a buffer gas.
Figure 21A:
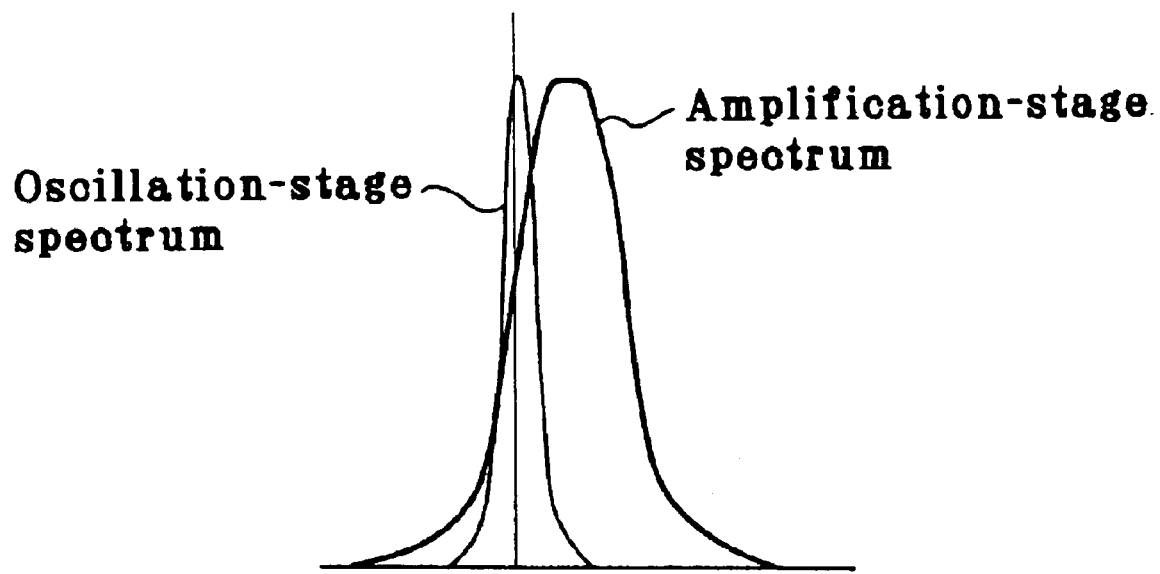
FIG. 21 is illustrative of the spectral waveform of a post-amplification laser beam emitted out of the amplification-stage laser in a state where there is a misalignment between the center wavelength of the oscillation-state laser and that of the amplification-stage laser.
Figure 21B:
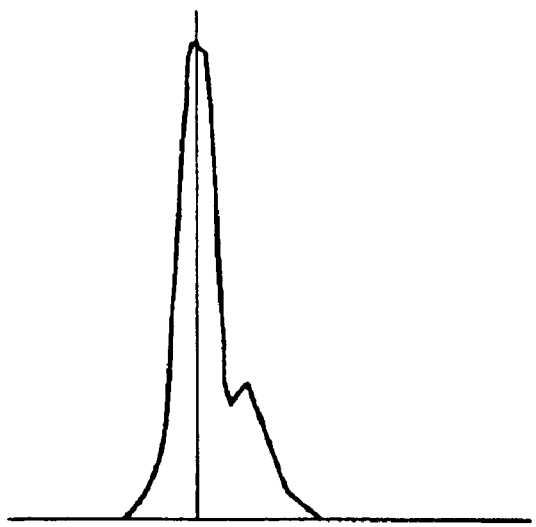

The first reason is the difference in the buffer gas used. The difference in the buffer gas between the oscillation-stage laser 10 and the amplification-stage laser 20 (e.g., neon buffer for the oscillation-stage laser and helium buffer for the amplification-stage laser) is responsible for such a center wavelength misalignment as shown in FIG. 21(a). The band-narrowing laser that is the oscillation-stage laser 10 is capable of long pulsation for narrowing spectral linewidths, and the use of the neon buffer is favorable for that laser because it is possible to make much use of the line-narrowing element. To obtain high outputs, the helium buffer is preferable for the amplification-stage laser 20. When the helium buffer gas and neon buffer gas are used at the same sealing pressure, there is a center wavelength misalignment of the order of 0.32 to 0.36 pm as shown in FIG. 2.

Figure 3:
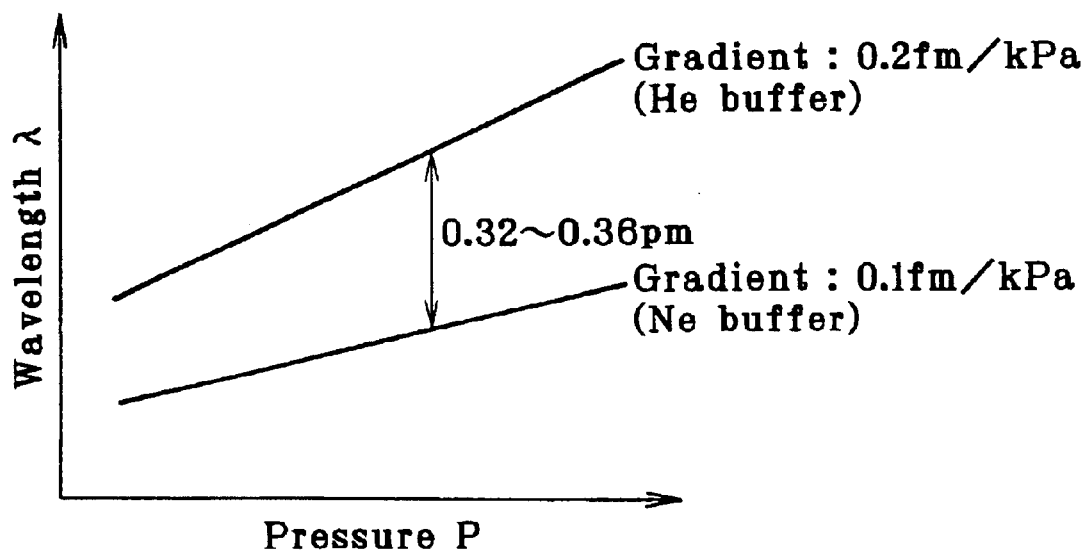
FIG. 3 is illustrative of a molecular fluorine laser system, showing a center wavelength misalignment due to a sealing gas pressure.

The second reason for the center wavelength misalignment is the difference in the gas-sealing pressure. Even when the same buffer gas is used for the oscillation-stage laser 10 and the amplification-stage laser 20, there is again a center wavelength misalignment due to a gas pressure difference if any. At a higher pressure, the center wavelength becomes long as shown in FIG. 3.

The third reason for the center wavelength misalignment is a shift of wavelength selection in the line-narrowing unit. Referring as an example to the injection locking mode, a shift of wavelength selection, if any, in the line-narrowing unit will cause a misalignment of the center wavelength of the laser beam emitted out of the amplification-stage laser 20 with respect to that emitted out of the oscillation-stage laser 10 upon oscillated by itself.

Often in this case, the center wavelength misalignment is caused by combinations of two or more of the aforesaid three reasons.

Besides, other possible reasons for the center wavelength misalignment include (1) the partial pressure of fluorine in the laser gas, (2) discharge voltage (voltage applied to electrodes), and (3) gas temperature. However, the center wavelength misalignment due to (1) and (2) was negligibly small, and the center wavelength misalignment due to (3) the gas temperature is equivalent to that due to pressure because the laser chamber has a constant volume.

Figure 17A:
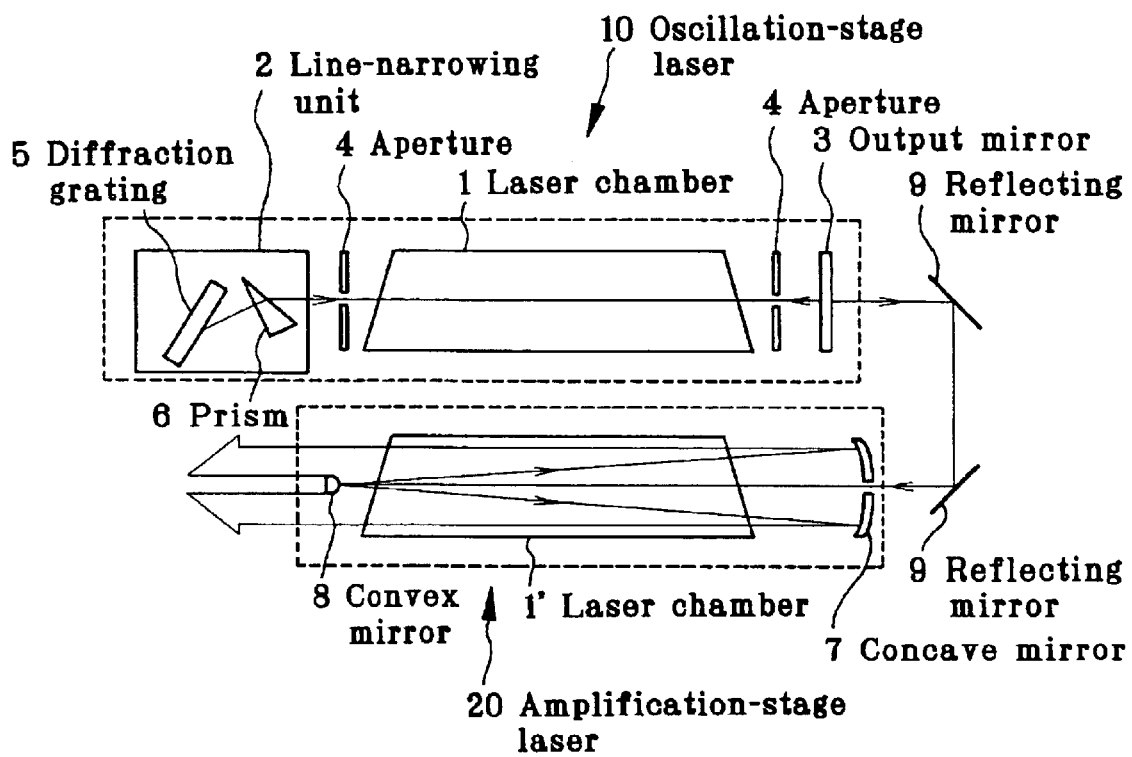
FIGS. 17(a) and 17(b) are illustrative of one exemplary arrangement of the injection locking mode of two-stage laser system.
Figure 17B:
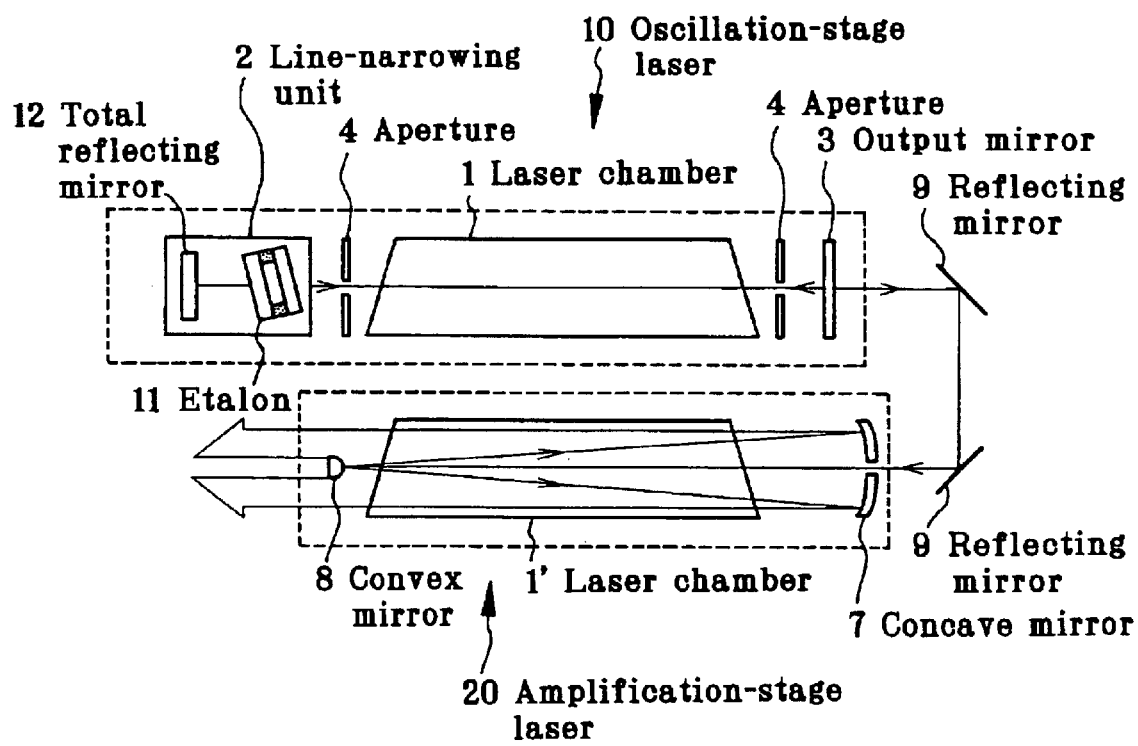
Figure 18A:
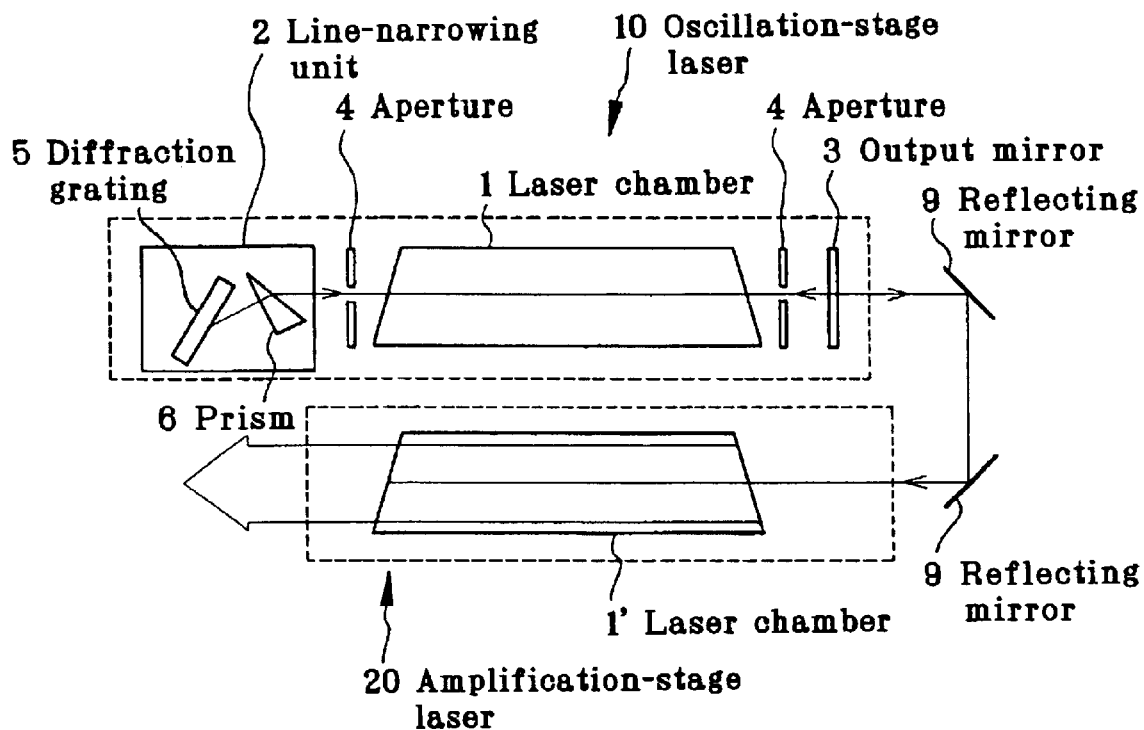
FIGS. 18(a) and 18(b) are illustrative of one exemplary arrangement of the MOPA mode of two-stage laser system.
Figure 18B:
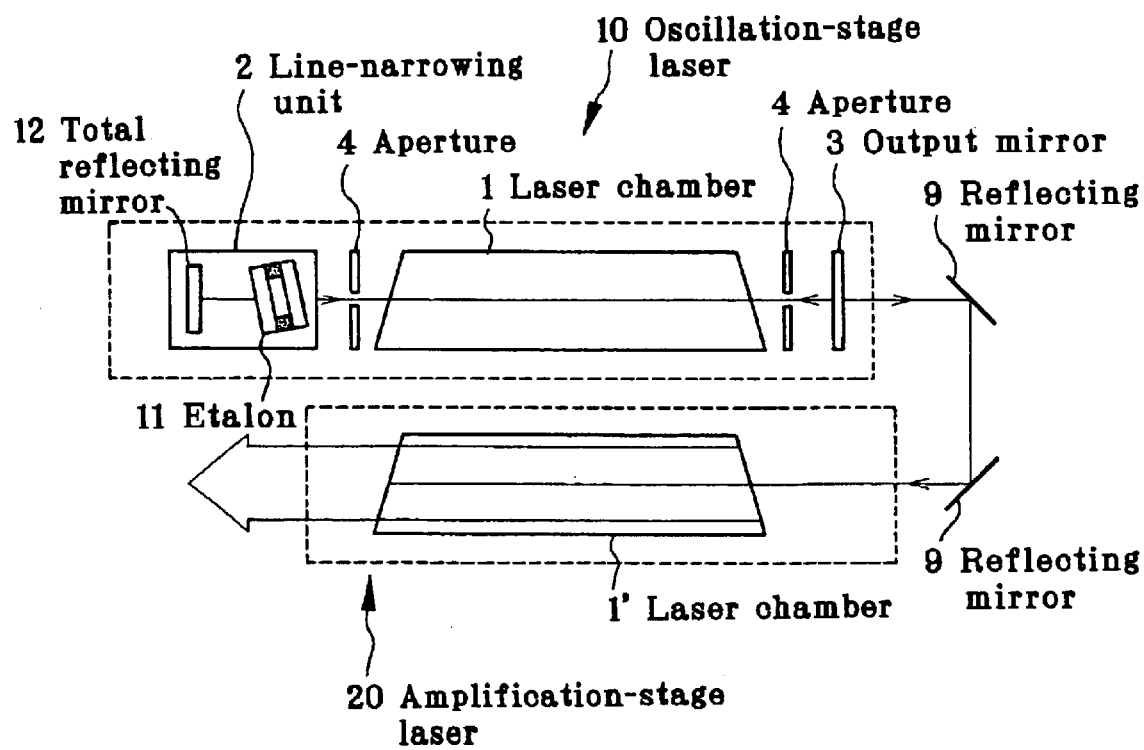
Figure 19:
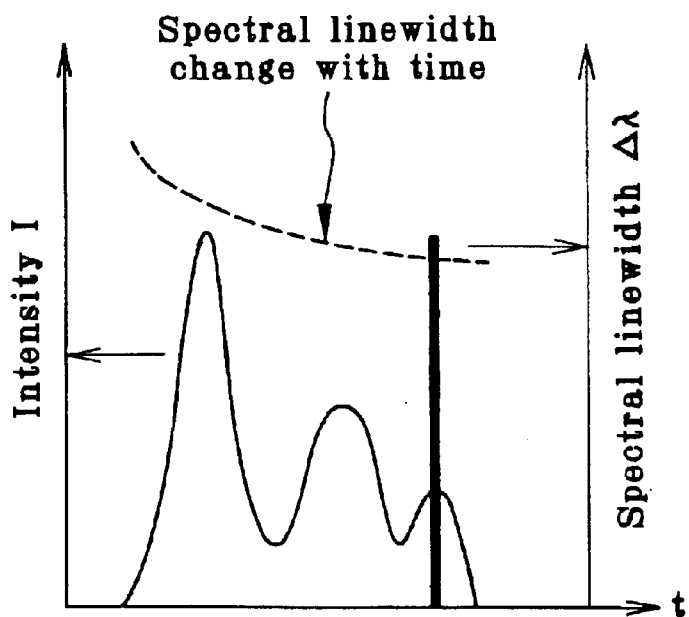
FIG. 19 is illustrative in schematic of the spectral waveform vs. spectral linewidth change-with-time relationships in a two-stage laser mode of molecular fluorine laser system.
Figure 20:
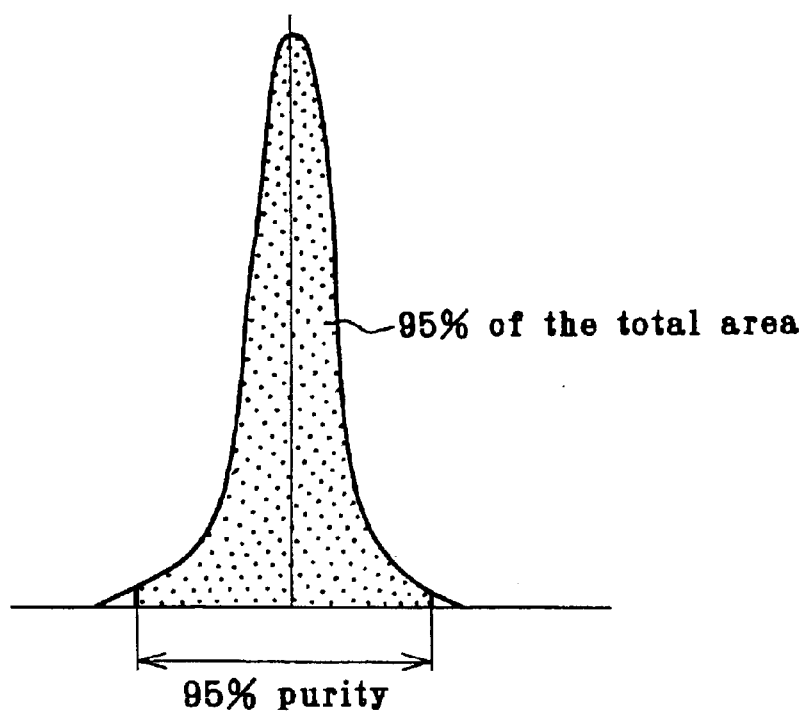
FIG. 20 is illustrative of a 95% purity.

Referring back to FIG. 1, the photolithographic molecular fluorine laser system to which the injection locking mode is applied comprises an oscillation-stage laser 10 and an amplification-stage laser 20. The oscillation-stage laser 10 is built up of a laser chamber 1, a line-narrowing unit (module) 2 and an output mirror 3 that are located at both ends of the laser chamber 1 to form a resonator and apertures 4, 4' for limiting a laser beam, and the amplification-stage laser 20 is made up of a laser chamber 1', and a reflecting mirror 13 and an output mirror 14 that are located at both ends of the laser chamber 1' to form a resonator. When an unstable resonator is used for the amplification-stage laser 20, a concave mirror is used for the reflecting mirror 13 while a convex mirror is used for the output mirror 14. The line-narrowing unit 2 in the oscillation-stage laser 10 may be constructed either using a prism 6 and a diffraction grating 5 as shown in FIGS. 17 and 18 or using an etalon 11 and a total reflecting mirror 12.

In the arrangement of FIG. 1, a beam splitter 15 is interposed between the oscillation-stage laser 10 and the amplification-stage laser 20, a shutter 16 is interposed between the beam splitter 15 and the reflecting mirror 13, and another beam splitter 17 is located on the output side of the amplification-stage laser 20.

A laser beam given out from the oscillation-stage laser 10 and singled out by the beam splitter 15 is entered into a monitor 21, and a laser beam given out of the amplification-stage laser 20 and singled out by the beam splitter 17 is entered into a monitor 22. Output signals from the monitors 21 and 22 are entered into a controller 23, and a control signal from the controller 23 is sent to the line-narrowing unit 2 and a gas unit 24 that controls the gas pressures within the laser chambers 1 and 1'.

Reference is now made to how to control central wavelength tuning in such an arrangement.

There are the following three approaches to wavelength adjustment:

(1) while $\lambda 1$ remains fixed, $\lambda 2$ is controlled;
(2) $\lambda 1$ is controlled, while $\lambda 2$ remains fixed; and
(3) $\lambda 1$ is controlled, and $\lambda 2$ is controlled.

Here $\lambda 1$ is the center wavelength of the oscillation-stage laser 10, and $\lambda 2$ is the center wavelength of the amplification-stage laser 20.

First of all, an account is given of how to control center wavelength tuning by controlling the wavelength of the amplification-stage laser 20 side while the wavelength $\lambda 1$ of the oscillation-stage laser 10 side remains fixed. To this end, wavelength tuning is performed by controlling the gas pressure, etc. for the amplification-stage laser 20.

In the arrangement of FIG. 1, a part of the laser beam emitted out of the oscillation-stage laser 10 is singled out by the beam splitter 15, and then guided to the monitor 21. The monitor 21 detects the center wavelength $\lambda 1$ of the laser beam emitted out of the oscillation-stage laser 10, and then sends data to the controller 23.

While the shutter 16 between the oscillation-stage laser 10 and the amplification-stage laser 20 is placed in a closed state, a part of the laser beam emanating from the amplification-stage laser 20 per se and so not subjected to amplification is singled out by the beam splitter 17, and then guided to the monitor 22. The monitor 22 detects the center wavelength $\lambda 2$ of the laser beam emitted out of the amplification-stage laser 20, and then sends data to the controller 23.

The monitors 21 and 22 used herein are capable of detecting the center wavelengths $\lambda 1$ and $\lambda 2$. On the basis of the received data, the controller 23 determines by calculation the center wavelengths $\lambda 1$ and $\lambda 2$ and compares both.

The controller 23 controls the gas unit 24 to keep the pressure within the laser chamber 1 in the oscillation-stage laser 10 constant. The controller 23 also controls the line-narrowing unit 2 on the basis of center wavelength data coming from the monitor 21, so that the center wavelength of the laser beam emitted out of the oscillation-stage laser 10 is fixed at $\lambda 1$.

Subsequently, the center wavelength $\lambda 2$ of the laser beam emitted out of the amplification-stage laser 20 itself is regulated such that $\lambda 2 = \lambda 1$. Regulation of the wavelength $\lambda 2$ is carried out by controlling the pressure of the gas within the laser chamber 1' in the amplification-stage laser 20 in the following manners.

$\lambda 2 > \lambda 1$

Figure 4:
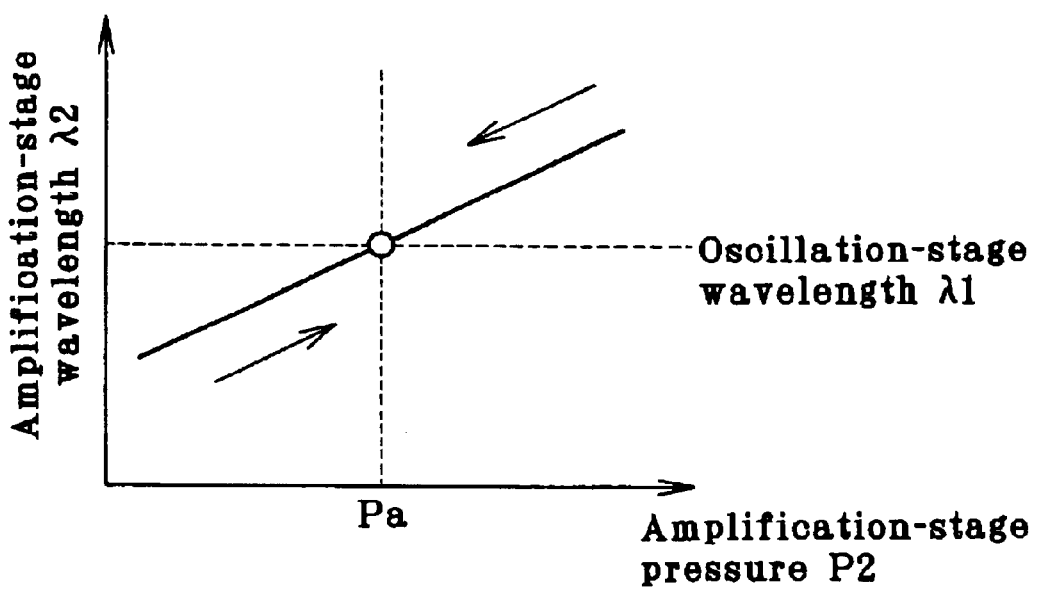
FIG. 4 is illustrative of how to carry out tuning by controlling the gas pressure in the amplification-stage laser

As already explained, when the pressure of the gas in the laser chamber 1' is high, the center wavelength is shifted to a longer wavelength side; the controller 23 controls the gas unit 24 so that, as shown in FIG. 4, the gas pressure P2 within the laser chamber 1' in the amplification-stage laser 20 is decreased until that gas pressure P2 coincides with the gas pressure Pa within the laser chamber 1', which corresponds to the wavelength $\lambda 1$.

$\lambda 2 < \lambda 1$

The controller 23 controls the gas unit 24 so that, as shown in FIG. 4, the gas pressure P2 within the laser chamber 1' in the amplification-stage laser 20 is increased until that gas pressure P2 coincides with the gas pressure Pa within the laser chamber 1', which corresponds to the wavelength $\lambda 1$.

Suppose here that the same buffer gas species were used for the oscillation-stage laser 10 and the amplification-stage 20. As a result of the aforesaid control, the pressure within the laser chamber 1 in the oscillation-stage laser 10 will be substantially identical with that within the laser chamber 1' in the amplification-stage laser 20. Suppose on the other hand that different buffer gas species were used. As a result of the aforesaid control, the pressure within the laser chamber 1 in the oscillation-stage laser 10 will differ from that within the laser chamber 1' in the amplification-stage laser 20.

In the aforesaid procedure, the center wavelength $\lambda 2$ of the laser beam emitted out of the amplification-stage laser 20 itself is detected using the shutter 16. In the MOPA mode, however, that wavelength $\lambda 2$ cannot be detected because there is no laser resonator in the amplification-stage laser 20. In other words, this control procedure can be applied to only the injection locking mode of two-stage laser.

The construction of another embodiment of the photolithographic molecular fluorine laser system is now explained with reference to FIG. 5. Although this embodiment is directed to a photolithographic molecular fluorine laser system to which the injection locking mode is applied, it may also be applied to the MOPA mode where the reflecting mirror 13 and output mirror 14 that form the resonator for the amplification-stage laser 20 are dispensed with.

Figure 5:
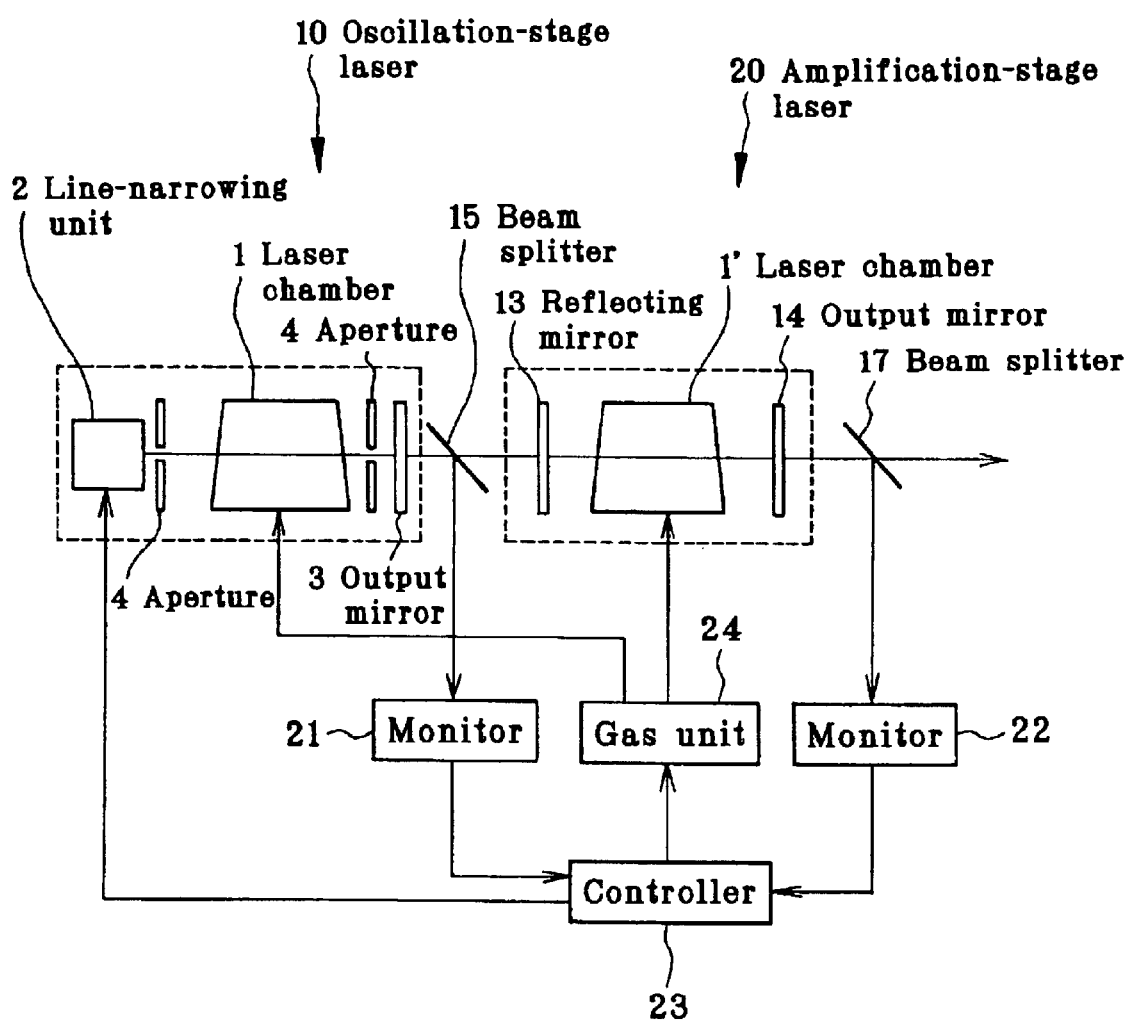
FIG. 5 is a system block diagram for another embodiment of the photolithographic molecular fluorine laser system.

The embodiment of FIG. 5 is different in construction from the embodiment of FIG. 1 in that there is no shutter 16 between the oscillation-stage laser 10 and the amplification-stage laser 20, i.e., in terms of the control process. More specifically, in this embodiment an oscillation-stage spectral purity $\Delta\lambda p1$ is compared with a post-amplification spectral purity $\Delta\lambda p3$.

A part of the laser beam emitted out of the oscillation-stage laser 10 is singled out by the beam splitter 15, and then guided to the monitor 21. The monitor 21 detects the spectral waveform of the laser beam emitted out of the oscillation-stage laser 10, and then sends data to the controller 23.

On the other hand, a part of the laser beam emitted out of the amplification-stage laser 20 where the seed laser beam from the oscillation-stage laser 10 has been amplified is singled out by the laser splitter 17, and then guided to the monitor 22. The monitor 22 detects the spectral waveform of a laser beam emitted out of the amplification-stage laser 20, and then sends data to a controller.

The monitors 21 and 22 used herein are capable of detecting spectral waveforms. The monitor 21 can also detect the center wavelength λ1 of the laser beam emitted out of the oscillation-stage laser 10.

On the basis of the received data, the controller 23 determines by calculation the spectral purity Δλp1 of the laser beam emitted out of the oscillation-stage laser 10 and the spectral purity Δλp3 of the post-amplification laser beam emitted out of the amplification-stage laser 20 and compares both.

On the basis of the results, the gas pressure is regulated in the following two manners:

(1) while the pressure on the oscillation-stage laser 10 side remains fixed, the pressure on the amplification-stage laser 20 side is controlled, and (2) the pressure on the oscillation-stage laser 10 side is controlled while the pressure on the amplification-stage laser 20 side remains fixed.

Here how to control the pressure on the amplification-stage laser 20 side is explained. The controller 23 controls the gas unit 24 to keep the pressure within the laser chamber 1 in the oscillation-stage laser 10 constant, and controls the line-narrowing unit 2 on the basis of center wavelength data from the monitor 21, so that the center wavelength of the laser beam emitted out of the oscillation-stage laser 10 is fixed at λ1.

Subsequently, the controller 23 controls the gas pressure within the laser chamber 1' in the amplification-stage laser 20 in such a way that Δλp3=A×Δλp1 where A is of the order 1 to 3. Usually, the laser beam emitted out of the amplification-stage laser 20 includes an ASE component occurring at the amplification-stage laser 20. Accordingly, the spectral purity αλp3 of the post-amplification laser beam emitted out of the amplification-stage laser 20 is often higher than the spectral purity Δλp1 of the laser beam emitted out of the oscillation-stage laser 10. Experimentation by the inventor has taught that when the post-amplification laser beam emitted out of the amplification-stage laser 20 is narrowed to a spectral linewidth commonly available for photolithography, its purity Δλp3 has a value between about 1 and about 3 times as high as the spectral purity Δλp1 of the laser beam emitted out of the oscillation-stage laser 10.

Figure 6:
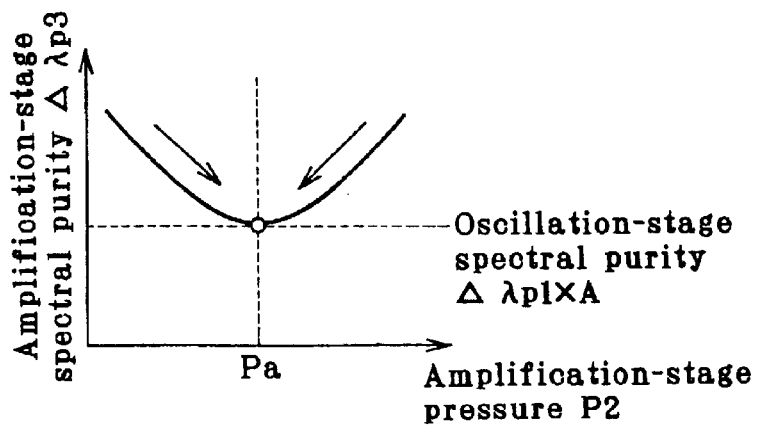
FIG. 6 is illustrative of a tuning process wherein when the oscillation-stage spectral purity is compared with the amplification-stage spectral purity, the gas pressure for the amplification-stage laser is controlled.

How to control the gas pressure in this case is now explained. As shown in FIG. 6, the controller 23 first controls the gas unit 24 to increase the gas pressure P2 within the laser chamber 1' in the amplification-stage laser 20. When the spectral purity Δλp3' after the change in the gas pressure is lower than the spectral purity Δλp3 before the change in the gas pressure, the controller 23 then controls the gas unit 24 in such a direction that the pressure P2 increases until Δλp3=A×Δλp1.

On the other hand, when the spectral purity Δλp3' after the change in the gas pressure is higher than the spectral purity Δλp3 before the change in the gas pressure, the controller 23 then controls the gas unit 24 in such a direction that the pressure P2 decreases until Δλp3=A×Δλp1.

This procedure may be modified as follows. That is, the controller 23 first controls the gas unit 24 to decrease the gas pressure P2 within the laser chamber 1' in the amplification-stage laser 20. When the spectral purity Δλp3' after the change in the gas pressure is lower than the spectral purity Δλp3 before the change in the gas pressure, the controller 23 then controls the gas unit 24 in such a direction that the pressure P2 decreases until Δλp3=A×Δλp1.

On-the other hand, when the spectral purity Δλp3' after the change in the gas pressure is higher than the spectral purity Δλp3 before the change in the gas pressure, the controller 23 then controls the gas unit 24 in such a direction that the pressure P2 increases until Δλp3=A×Δλp1.

Because, as mentioned above, the spectral purity Δλp3 of the post-amplification gas pressure emitted out of the amplification-stage laser 20 is monitored, there is no need of interposing any shutter between the oscillation-stage laser 10 and the amplification-stage laser 20, as shown in FIG. 5.

Thus, the present control process is applicable just only to the injection locking mode but to the MOPA mode (that does not rely on the reflecting mirror 13 and output mirror 14) as well.

Figure 7:
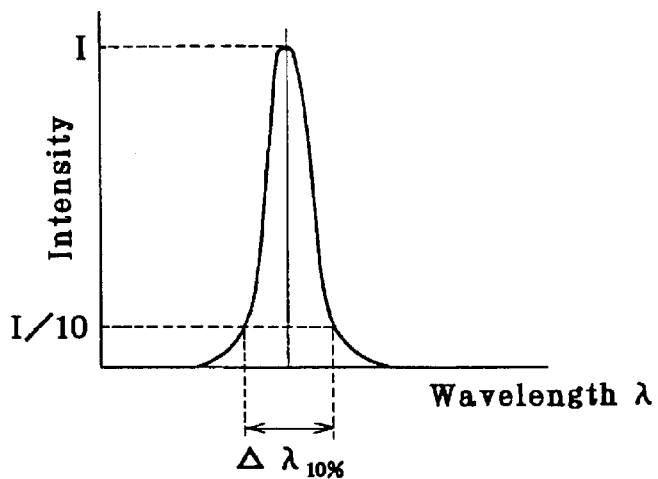
FIG. 7 is a diagram illustrative of a spectral 10% linewidth.

Specifically but not exclusively, the spectral purity Δλp1, Δλp3 is 95% purity; for instance, however, it is acceptable to use spectral 10% linewidth Δλp1$_{10\%}$, Δλp3$_{10\%}$. The wording "spectral 10% linewidth" is understood to refer to a spectral linewidth at a position where the intensity peak of a spectral waveform becomes 10%, as shown in FIG. 7. In this conjunction, it is noted that instead of the spectral 10% linewidth, it is acceptable to use a spectral linewidth that accounts for 5%, 20%, . . . of the spectral peak intensity. In this case, the aforesaid coefficient A is not always A=ca. 1 to 3.

Figure 8:
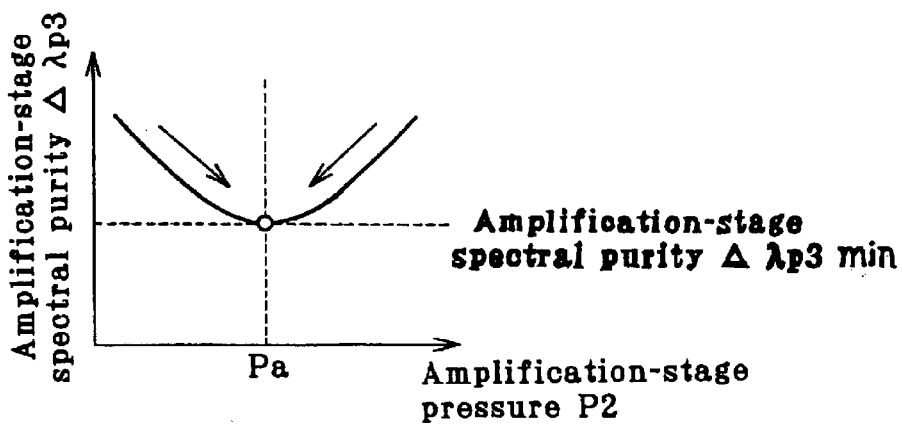
FIG. 8 is illustrative of a tuning process wherein the gas pressure for the amplification-stage laser is controlled such that the spectral purity of a post-amplification laser beam emitted out of the amplification-stage laser is minimized.

In the embodiment explained with reference to FIG. 5, the spectral purity Δλp1 (or Δλ1$_{10\%}$, etc.) of the laser beam emitted out of the oscillation-stage laser 10 and the spectral purity Δλp3 (or Δλ3$_{10\%}$, etc.) of the post-amplification laser beam emitted out of the amplification-stage laser 20 are determined by calculation and compared with each other. However, it is acceptable to determine by calculation only the spectral purity Δλp3 (or Δλ3$_{10\%}$, etc.) of the post-amplification laser beam emitted out of the amplification-stage laser 20, and then control the gas pressure P2 within the laser chamber 1' in the amplification-stage laser 20 in such a way that the purity is minimized as shown in FIG. 8.

Next, one modification to the embodiment where the oscillation-stage spectral purity Δλp1 is compared with the post-amplification spectral purity Δλp3 is explained. In this modified embodiment, ideal spectral purity Δλ0 is compared with the post-amplification spectral purity Δλp3.

To this end, the ideal purity for the post-amplification laser beam emitted out of the amplification-stage laser 20 should be predetermined by calculation, and stored in the controller 23.

For the derivation of the ideal purity Δλ0, the Gaussian function I=exp($-x^2$/k$_g$) or the Lorents function I=1/(1+$x^2$)/k$_l$) is used as a spectral waveform. Here I is the spectral intensity, x is the wavelength, and k$_g$ and k$_l$ are each the constant. For instance, given a spectral waveform having an FWHM of 0.2 pm, k$_g$=$-1.443\times10^{-26}$ and k$_l$=$1\times10^{-26}$.

In the arrangement of FIG. 5, a part of the laser beam emitted out of the oscillation-stage laser 10 is singled out by the-beam splitter 15, and then guided to the monitor 21. The monitor 21 detects the center wavelength λ1 of the laser beam emitted out of the oscillation-stage laser 10, and then sends data to the controller 23.

On the other hand, a part of the laser beam emitted out of the amplification-stage laser 20 where the seed laser beam from the oscillation-stage laser 10 has been amplified is singled out by the beam splitter 17, and then guided to the monitor 22. The monitor 22 detects the spectral purity Δλp3 of the laser beam emitted out of the amplification-stage laser 20, and then sends data to the controller 23.

The monitor 21 used herein is capable of detecting the center wavelength λ1 of the laser beam emitted out of the oscillation-stage laser 10, and the monitor 22 is capable of detecting the spectral purity Δλp3.

The controller 23 controls the gas unit 24 to keep the pressure within the chamber 1 in the oscillation-stage laser 10 constant. The controller 23 also controls the line-narrowing unit 2 on the basis of center wavelength data from the monitor 21, so that the center wavelength of the laser beam emitted out of the oscillation-stage laser 10 is fixed at $\lambda 1$.

On the basis of the stored data and the received data, the controller 23 compares the ideal purity $\Delta\lambda 0$ with the post-amplification spectral purity $\Delta\lambda p3$.

Subsequently, the controller 23 controls the gas pressure within the laser chamber in the amplification-stage laser 20 in such a way that $\Delta\lambda p3=\Delta\lambda 0$.

Figure 9:
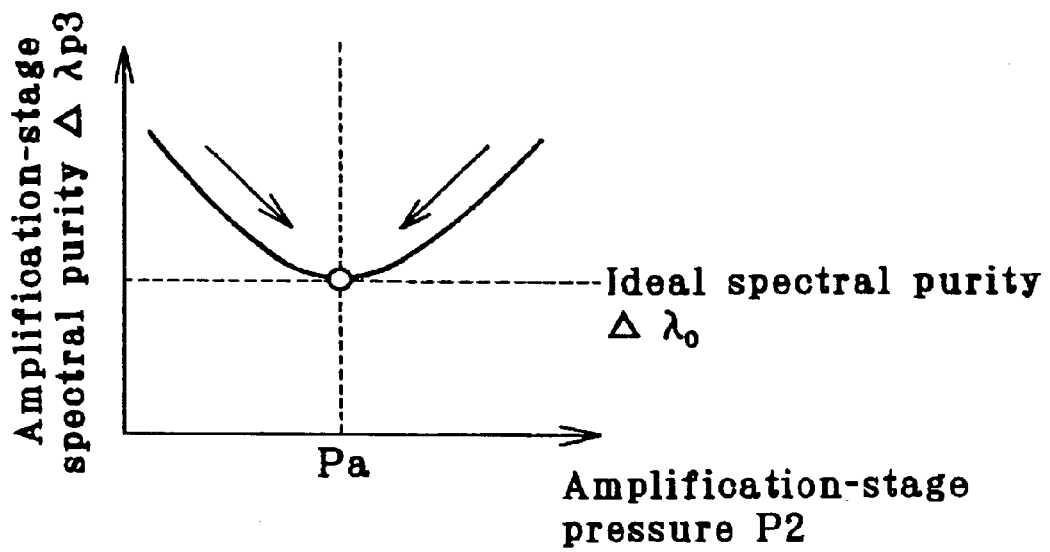
FIG. 9 is illustrative of a tuning process wherein the gas pressure for the amplification-stage laser is controlled such that the post-amplification spectral purity is minimized relative to the ideal spectral purity.

How to control the gas pressure in this case is now explained. As shown in FIG. 9, the controller 23 first controls the gas unit 24 to increase the gas pressure P2 within the laser chamber 1' in the amplification-stage laser 20. When the spectral purity $\Delta\lambda p3'$ after the change in the gas pressure is lower than the spectral purity $\Delta\lambda p3$ before the change in the gas pressure, the controller 23 then controls the gas unit 24 in such a direction that the pressure P2 increases until $\Delta\lambda p3=\Delta\lambda 0$. On the other hand, when the spectral purity $\Delta\lambda p3'$ after the change in the gas pressure is higher than the spectral purity $\Delta\lambda p3$ before the change in the gas pressure, the controller 23 then controls the gas unit 24 in such a direction that the pressure P2 decreases until $\Delta\lambda p3=\Delta\lambda 0$.

This procedure may be modified as follows. That is, the controller 23 first controls the gas unit 24 to decrease the gas pressure P2 within the laser chamber 1' in the amplification-stage laser 20. When the spectral purity $\Delta\lambda p3'$ after the change in the gas pressure is lower than the spectral purity $\Delta\lambda p3$ before the change in the gas pressure, the controller 23 then controls the gas unit 24 in such a direction that the pressure P2 decreases until $\Delta\lambda p3=\Delta\lambda 0$. On the other hand, when the spectral purity $\Delta\lambda p3'$ after the change in the gas pressure is higher than the spectral purity $\Delta\lambda p3$ before the change in the gas pressure, the controller 23 then controls the gas unit 24 in such a direction that the pressure P2 increases until $\Delta\lambda p3=\Delta\lambda 0$.

Because, as mentioned above, the spectral purity $\Delta\lambda p3$ of the post-amplification gas pressure emitted out of the amplification-stage laser 20 is monitored, there is no need of interposing any shutter between the oscillation-stage laser 10 and the amplification-stage laser 20, as shown in FIG. 1. Thus, the present control process is applicable just only to the injection locking mode but to the MOPA mode as well. Moreover, since it is not always required to provide the monitor 21, the arrangement can be simplified.

An account is now given of a preferred embodiment of the invention wherein the left-to-right ratio of the oscillation-stage laser, $\Delta\lambda p1_{short}/\Delta\lambda p1_{long}$, is compared with the left-to-right ratio of the post-amplification spectral purity, $\Delta\lambda p3_{short}/\Delta\lambda p3_{long}$.

In the arrangement of FIG. 5, a part of the laser beam emitted out of the oscillation-stage laser 10 is singled out by the beam splitter 15, and then guided to the monitor 21. The monitor 21 detects the spectral waveform of the laser beam emitted out of the oscillation-stage laser 10, and then sends data to the controller 23.

On the other hand, a part of the laser beam emitted out of the amplification-stage laser 20 where the seed laser beam from the oscillation-stage laser 10 has been amplified is singled out by the beam splitter 17, and then guided to the monitor 22. The monitor 22 detects the spectral waveform of the laser beam emitted out of the amplification-stage laser 20, and then sends data to the controller 23.

The monitors 21, 22 used herein are capable of detecting spectral waveforms, and the monitor 21 is capable of detecting the center wavelength $\lambda 1$ of the laser beam emitted out of the oscillation-stage laser 10.

On the basis of the received spectral data, the controller 23 determines by calculation the purities, $\Delta\lambda p1_{short}$ and $\Delta\lambda p1_{long}$, on a shorter wavelength side (left) and a longer wavelength side (right) with respect to the center wavelength, which are included in the spectral purity $\Delta\lambda p1$ of the laser beam emitted out of the oscillation-stage beam 10, and the purities, $\Delta\lambda p3_{short}$ and $\Delta\lambda p3_{long}$, on a shorter wavelength side (left) and a longer wavelength side (right) with respect to the center wavelength, which are included in the spectral purity $\Delta\lambda p3$ of the post-amplification laser beam emitted out of the amplification-stage laser 10.

Figure 10:
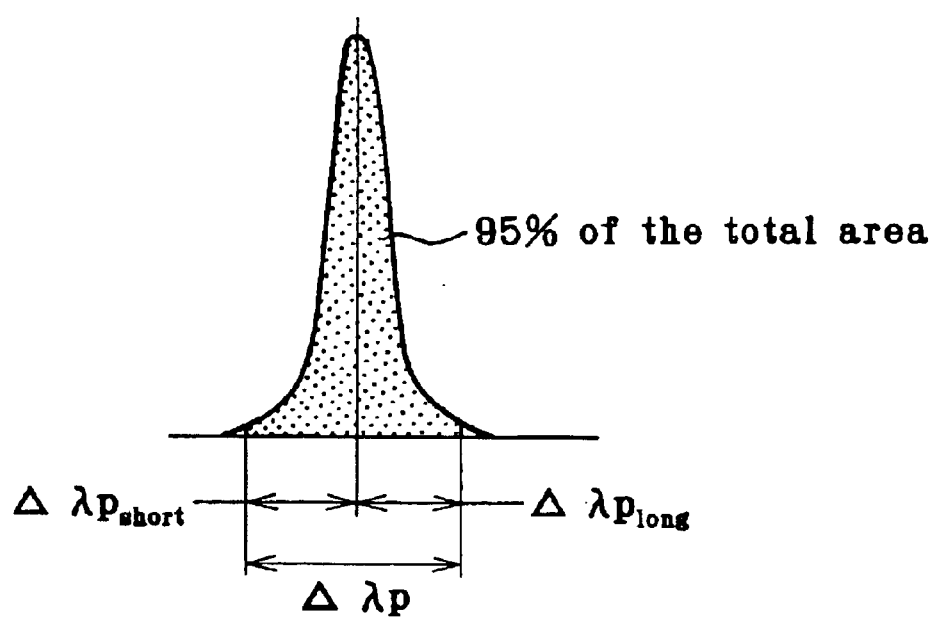
FIG. 10 is illustrative of a spectral purity on a shorter wavelength side and a spectral purity on a longer wavelength side.

The term "center wavelength" used herein is understood to refer to the wavelength at which the intensity of a spectral wavelength peaks or the center value of a wavelength at half-value intensity. The purity $\Delta\lambda p_{short}$ on the shorter wavelength (left) side is understood to mean a linewidth that accounts for 95% of the total area of a spectral waveform on the shorter wavelength (left) side with respect to the center wavelength, and the purity $\Delta\lambda p_{long}$ on the longer wavelength (right) side is understood to mean a linewidth that accounts for 95% of the total area of a spectral waveform on the longer wavelength (right) side with respect to the center wavelength, as shown in FIG. 10.

The controller 23 determines by calculation $\Delta\lambda p1_{short}/\Delta\lambda p1_{long}$, and $\Delta\lambda p3_{short}/\Delta\lambda p3_{long}$.

Then, the controller 23 controls the gas unit 24 to keep the pressure within the laser chamber 1 in the oscillation-stage laser 10 constant, and on the basis of center wavelength data from the monitor 21, the controller 23 controls the line-narrowing unit 2 in such a way that the center wavelength of the laser beam emitted out of the oscillation-stage laser 10 is fixed at $\lambda 1$.

As the pressure is kept constant, the value of $\Delta\lambda p1_{short}/\Delta\lambda p1_{long}$ in the oscillation-stage laser 10 is fixed.

Subsequently, the controller 23 controls the gas pressure within the laser chamber 1' in the amplification-stage laser 20 in such a way that $\Delta\lambda p3_{short}/\Delta\lambda p3_{long}=\Delta\lambda p1_{short}/\Delta\lambda p1_{long}$.

How to control the gas pressure in this case is now explained.

$$\Delta\lambda p3_{short}/\Delta\lambda p3_{long} > \Delta\lambda p1_{short}/\Delta\lambda p1_{long}$$

Figure 11A:
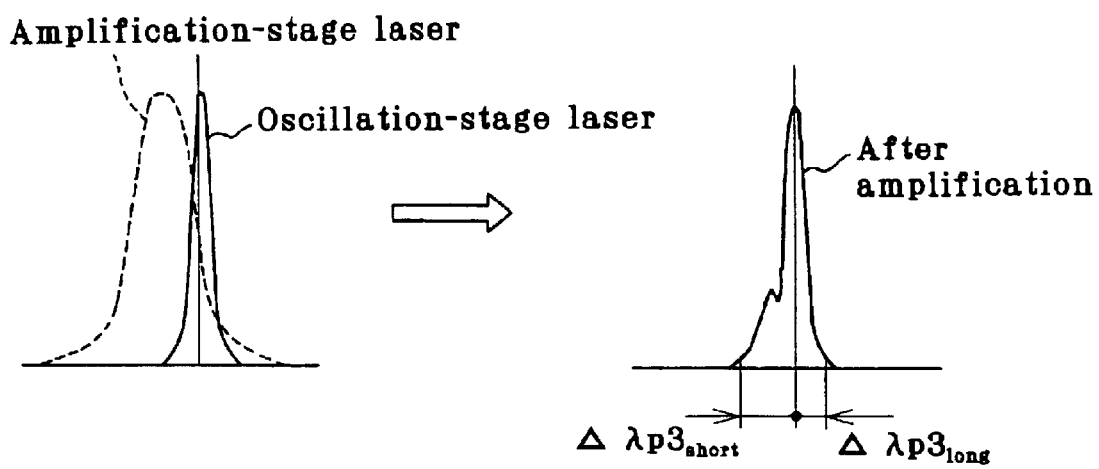
FIG. 11(a) and 11(b) are illustrative of what spectral waveform a post-amplification laser beam emitted out of the amplification-stage laser has when there is a misalignment of the center wavelength of the laser beam emitted out of the amplification-stage laser with respect to that of the laser beam emitted out of the oscillation-stage laser.
Figure 12:
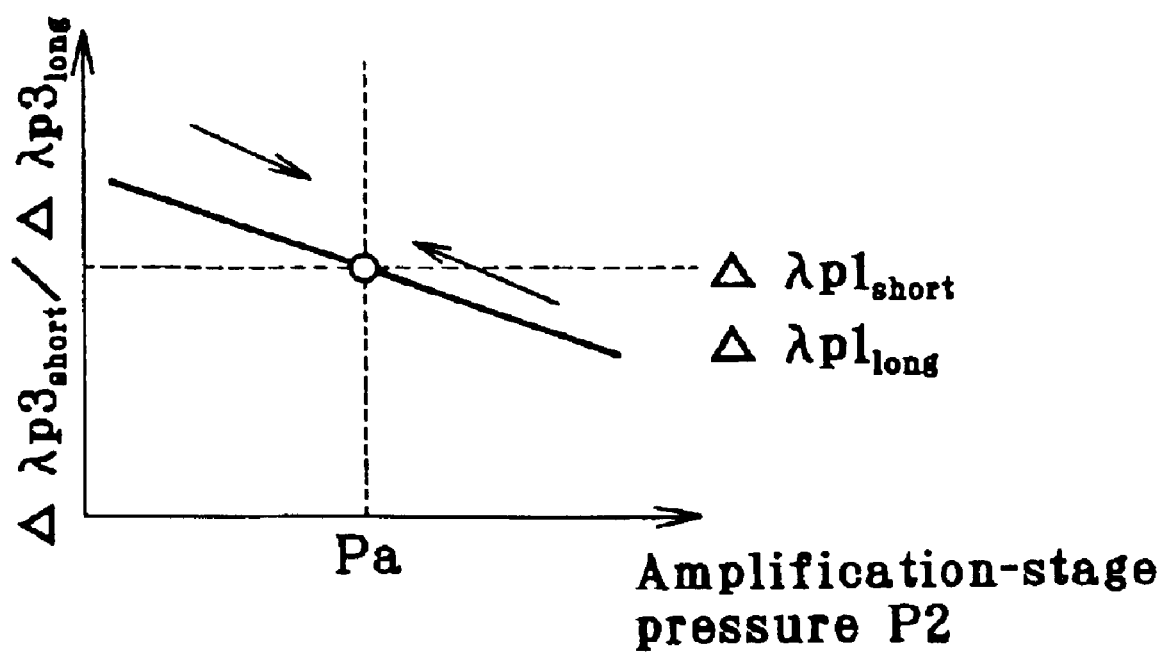
FIG. 12 is illustrative of a tuning process wherein the gas pressure for the amplification-stage laser is controlled such that the left-to-right ratio of the oscillation-stage spectral purity is compared with and matched to that of the post-amplification spectral purity.

In this state, as shown in FIG. 11(a), the center wavelength of the laser beam emitted out of the amplification-stage laser 20 on the assumption that the laser 20 is oscillated by itself is found on the shorter wavelength side with respect to the center wavelength of the laser beam emitted out of the oscillation-stage laser 10. Accordingly, the controller 23 controls the gas unit 24 to increase the gas pressure P2 within the laser chamber 1' in the amplification-stage laser 20 as shown in FIG. 12, until that pressure coincides with the gas pressure Pa within the laser chamber 1', which corresponds to $\Delta\lambda p1_{short}/\Delta\lambda p1_{long}$.

$$\Delta\lambda p3_{short}/\Delta\lambda p3_{long} < \Delta\lambda p1_{short}/\Delta\lambda p1_{long}$$

Figure 11B:
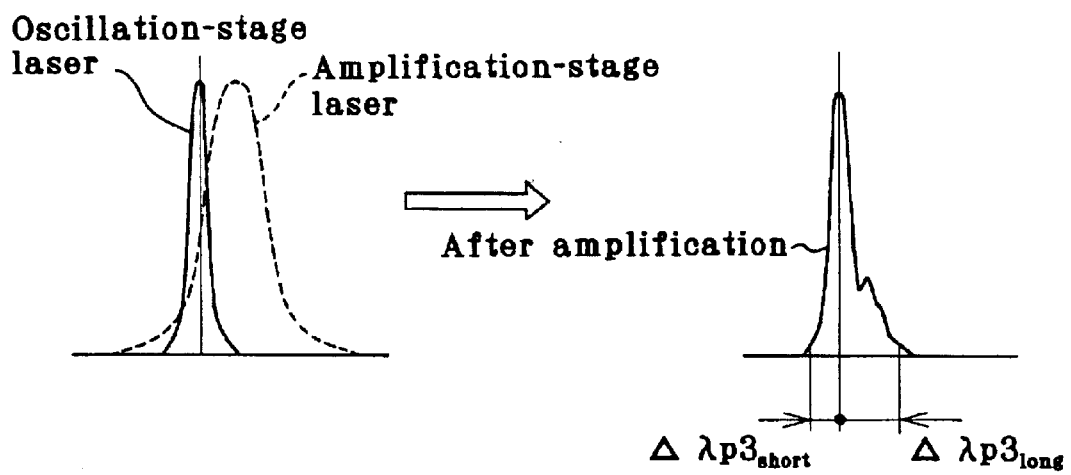

In this state, as shown in FIG. 11(b), the center wavelength of the laser beam emitted out of the amplification-stage laser 20 on the assumption that the laser is oscillated by itself is found on the longer wavelength side with respect to the center wavelength of the laser beam emitted out of the oscillation-stage laser 10. Accordingly, the controller 23 controls the gas unit 24 to decrease the gas pressure P2 within the laser chamber 1' in the amplification-stage laser 20 as shown in FIG. 12, until that pressure coincides with the gas pressure Pa within the laser chamber 1', which corresponds to $\Delta\lambda p1_{short}/\Delta\lambda p1_{long}$.

According to this embodiment wherein, as mentioned above, the purity $\Delta\lambda p3_{short}$ on the shorter wavelength (left) and the purity $\Delta\lambda p3_{long}$ on the longer wavelength (right) side with respect to the center wavelength, which are included in the spectral purity $\Delta\lambda p3$ of the post-amplification laser beam emitted out of the amplification-stage laser 20, are compared with each other, there is no need of interposing the shutter 16 between the oscillation-stage laser 10 and the amplification-stage laser 20 as shown in FIG. 1. Accordingly, this control process is applicable just only to the injection locking mode but to the MOPA mode as well. Since the monitor 21 is not always necessary, the arrangement can be simplified.

An account is now given of how to control the center wavelength λ1 of the oscillation-stage laser 10 and how to control both the center wavelength λ1 of the oscillation-stage laser 10 and the center wavelength λ2 of the amplification-stage laser 20 while the shutter 16 is interposed between the oscillation-stage laser 10 and the amplification-stage laser 20 as shown in FIG. 1.

In the arrangement of FIG. 1, a part of the laser beam emitted out of the oscillation-stage laser 10 is singled out by the beam splitter 15, and then guided to the monitor 21. The monitor 21 detects the center wavelength λ1 of the laser beam emitted out of the oscillation-stage laser 10, and then sends data to the controller 23.

While the shutter 16 between the oscillation-stage laser 10 and the amplification-stage laser 20 is in a closed state, a part of the laser beam emitted out of the amplification-stage laser 20 per se is singled out by the beam splitter 17, and then guided to the monitor 22. The monitor 22 detects the center wavelength λ2 of the laser beam emitted out of the amplification-stage laser 20, and then sends data to the controller 23.

The monitors 21, 22 used herein are capable of detecting the center wavelengths λ1, λ2.

On the basis of the received data, the controller 23 determines by calculation the center wavelengths λ1 and λ2, and compares both.

The controller 23 controls one or both of the center wavelength λ1 of the laser beam emitted out of the oscillation-stage laser 10 and the center wavelength λ2 of the laser beam emitted out of the amplification-stage laser 20 per se in such a way that λ2=λ1. Wavelength regulation is carried out by controlling the corresponding gas pressure.

For wavelength regulation, there are the following three approaches:

(1) while λ1 remains fixed, λ2 is controlled, (2) λ1 is controlled while λ2 remains fixed, and (3) λ1 is controlled, and λ2 is controlled.

Of (1), an account has already been given. Here, how to control the gas pressure in the case where (2) λ1 is controlled while λ2 remains fixed, and (3) both λ1 and λ2 are controlled is explained.

To control λ1 while λ2 remains fixed, the controller 23 first controls the gas unit 24 to keep the pressure within the laser chamber 1' in the amplification-stage laser 20 constant, so that while the shutter 16 is in a closed state, the center wavelength of the laser beam emitted out of the amplification-stage laser 20 per se is fixed at λ2.

Subsequently, the center wavelength λ1 of the laser beam emitted out of the oscillation-stage laser 10 is regulated such that λ1=λ2. Regulation of the center wavelength λ1 is carried out by controlling the pressure of the gas in the laser chamber 1 in the oscillation-stage laser 10. Control of the gas pressure is performed as follows.

λ1>λ2

Figure 13:
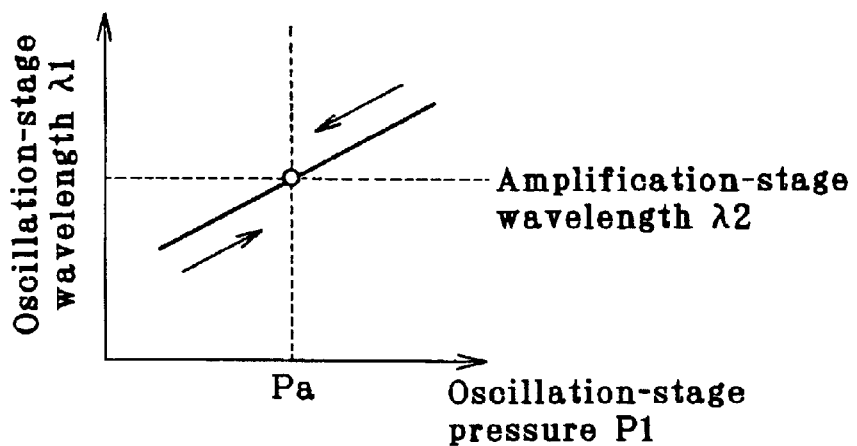
FIG. 13 is illustrative of a tuning process of controlling the gas pressure for the oscillation-stage laser so that the center wavelength of the oscillation-stage laser is controlled while the center wavelength of the amplification-stage laser remains fixed.

The controller 23 controls the gas unit 24 to decrease the gas pressure P1 within the laser chamber 1 in the oscillation-stage laser 10 as shown in FIG. 13, until that pressure coincides with the gas pressure Pa within the laser chamber 1 in the oscillation-stage laser 10, which corresponds to the wavelength λ2.

λ1<λ2

The controller 23 controls the gas unit 24 to increase the gas pressure P1 within the laser chamber 1 in the oscillation-stage laser 10, until that pressure coincides with the gas pressure Pa within the laser chamber 1 in the oscillation-stage laser 10, which corresponds to the wavelength λ2.

Where (3) both λ1 and λ2 are controlled, the controller 23 should pre-store the target wavelength 10.

Subsequently, both the center wavelength λ1 of the laser beam emitted out of the oscillation-stage laser 10 and the center wavelength λ2 of the laser beam emitted out of the amplification-stage laser 20 per se are regulated such that λ1=λ2=λ0. Regulation of the wavelengths λ1, λ2 are performed by control of the pressure of the gas within the laser chamber 1 in the oscillation-stage laser 10 and the pressure of the gas within the laser chamber 1' in the amplification-stage laser 20, respectively. It is here noted that for control of the center wavelength λ2, the shutter 16 is put into a closed state. Control of the gas pressure is then performed as follows.

λ1>λ0

Figure 14:
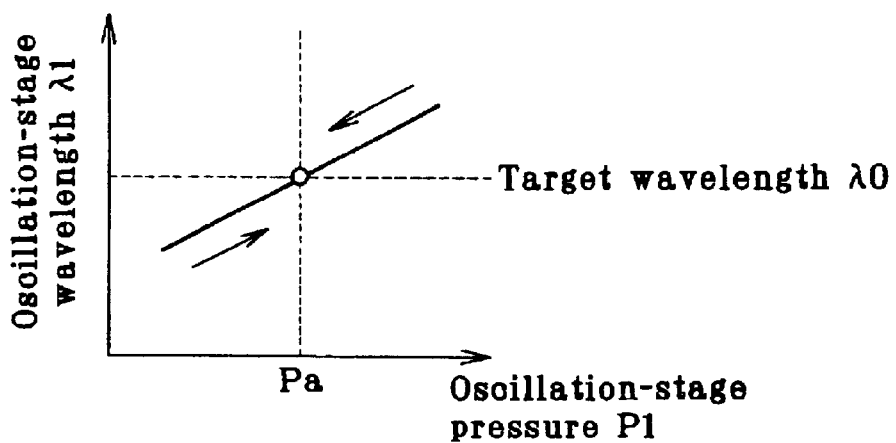
FIG. 14 is illustrative of a tuning process of controlling the gas pressure for the oscillation-stage laser so that both the center wavelengths of the oscillation-stage laser and amplification-stage laser are controlled for turning in to the target wavelength.

The controller 23 controls the gas unit 24 to decrease the gas pressure P1 within the laser chamber 1 in the oscillation-stage laser 10 as shown in FIG. 14, until that pressure coincides with the gas pressure Pa within the laser chamber 1 in the oscillation-stage laser 10, which corresponds to the target wavelength λ0.

λ1<λ0

The controller 23 controls the gas unit 24 to increase the gas pressure P1 within the laser chamber 1 in the oscillation-stage laser 10, until that pressure coincides with the gas pressure Pa within the laser chamber 1 in the oscillation-stage laser 10, which corresponds to the target wavelength λ0.

λ2>λ0

Figure 15:
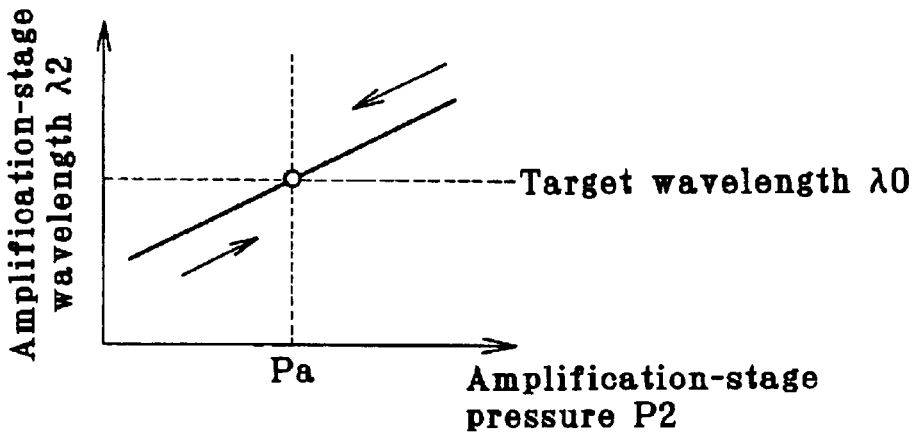
FIG. 15 is illustrative of a tuning process of controlling the gas pressure for the amplification-stage laser so that both the center wavelengths of the oscillation-stage laser and amplification-stage laser are controlled for turning in to the target wavelength.
Figure 16:
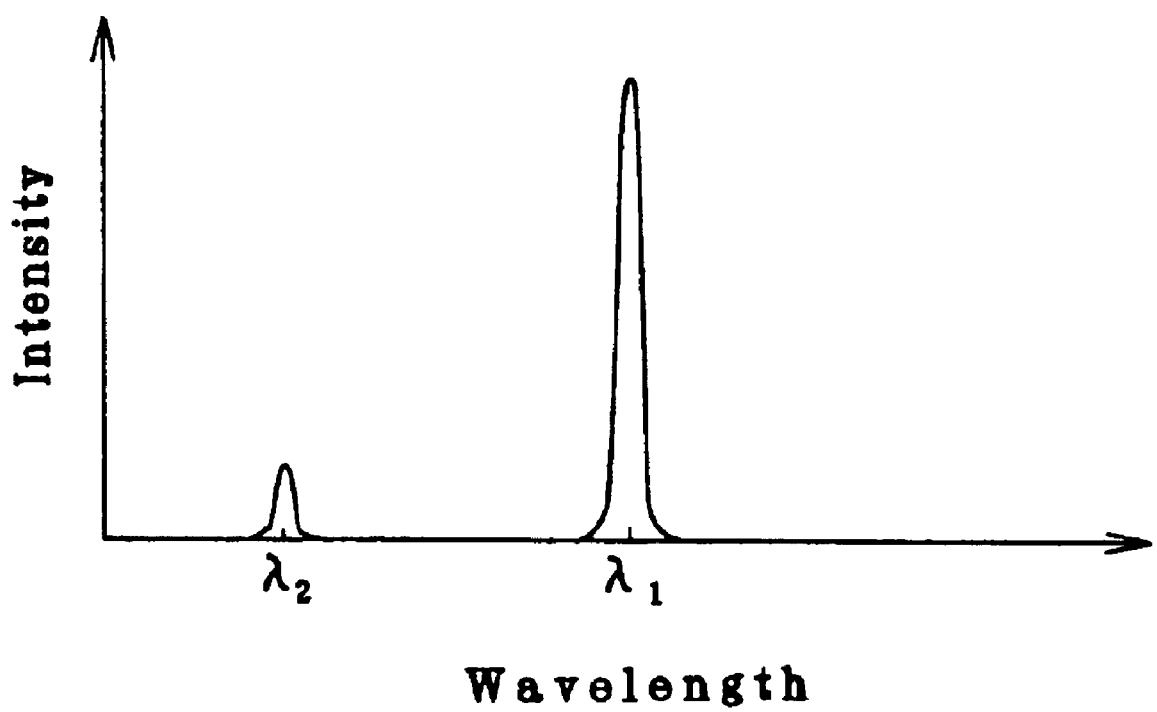
FIG. 16 is illustrative of primary oscillation wavelengths of a molecular fluorine laser.

The controller 23 controls the gas unit 24 to decrease the gas pressure P1 within the laser chamber 1' in the amplification-stage laser 20 as shown in FIG. 15, until that pressure coincides with the gas pressure Pa within the laser chamber 1' in the amplification-stage laser 20, which corresponds to the target wavelength λ0.

λ2<λ0

The controller 23 controls the gas unit 24 to increase the gas pressure P2 within the laser chamber 1' in the amplification-stage laser 20, until that pressure coincides with the gas pressure Pa within the laser chamber 1' in the amplification-stage laser 20, which corresponds to the target wavelength λ0.

With this control process wherein the center wavelength λ2 of the laser beam emitted out of the amplification-stage laser 20 per se is detected using the shutter 16. In the MOPA mode, however, the wavelength λ2 cannot be detected for lack of any laser resonator in the amplification-stage laser 20. In other words, the control process according to this embodiment is applicable only to the injection locking mode of two-stage laser.

Generally, when the aforesaid control process is performed while the same buffer gas species is used for the oscillation-stage laser 10 and the amplification-stage laser 20, the pressure within the laser chamber 1 in the oscillation-stage laser 10 is substantially the same as that within the laser chamber 1' in the amplification-stage laser 20, and when the aforesaid control process is effected using different buffer gas species, the pressure within the laser chamber 1 in the oscillation-stage laser 10 differs from that within the laser chamber 1' in the amplification-stage laser 20.

The present invention is now explained with reference to another embodiment wherein the oscillation-stage spectral purity Δλp1 compared with the post-amplification spectral purity Δλp3.

In the arrangement of FIG. 5, a part of the laser beam emitted out of the oscillation-stage laser 10 is singled out by the beam splitter 15, and then guided to the monitor 21. The monitor 21 detects the spectral waveform of the laser beam emitted out of the oscillation-stage laser 10, and then sends data to a controller 23.

On the other hand, a part of the laser beam emitted out of the amplification-stage laser 20 where the seed laser beam from the oscillation-stage laser 10 has been amplified is singled out by the laser splitter 17, and then guided to the monitor 22. The monitor 22 detects the spectral waveform of the laser beam emitted out of the amplification-stage laser 20, and then sends data to a controller.

The monitors 21 and 22 used herein are capable of detecting spectral waveforms. The monitor 21 can also detect the center wavelength λ1 of the laser beam emitted out of the oscillation-stage laser 10.

On the basis of the received data, the controller 23 determines by calculation the spectral purity Δλp1 of the laser beam emitted out of the oscillation-stage laser 10 and the spectral purity Δλp3 of the post-amplification laser beam emitted out of the amplification-stage laser 20, and compares both.

Specifically but not exclusively, the spectral purity Δ80 p1, Δλp3 should be 95% purity as mentioned; for instance, however, it is acceptable to use spectral 10% linewidth Δλp1$_{10\%}$, Δλp3$_{10\%}$. Alternatively, it is acceptable to use a spectral linewidth that accounts for 5%, 20%, . . . of the spectral peak intensity.

The controller 23 controls the gas unit 24 to keep the pressure within the laser chamber 1 in the oscillation-stage laser 10 constant, and controls the line-narrowing unit 2 on the basis of center wavelength data from the monitor 21 in such a way that the center wavelength of the laser beam emitted out of the oscillation-stage laser 10 is fixed at λ1.

Subsequently, the controller 23 controls the gas pressure within the laser chamber 1' in the-amplification-stage laser 20 in such a way that Δλp3=A×Δλp1 (or Δλ3$_{10\%}$=A× Δλ1$_{10\%}$, etc.) where A is of the order of 1 to 5. Here A is limited to the order to 1 to 3 for the same reasons as mentioned above.

Regulation of the gas pressure is performed in the following two manners:

(1) while the pressure on the oscillation-stage laser 10 stage remains fixed, the pressure on the amplification-stage laser 20 stage is controlled, and (2) the pressure on the oscillation-stage laser 10 side is controlled while the pressure on the amplification-stage laser 20 remains fixed.

Here an account is given of the manner (2) because the manner (1) has been explained.

The controller 23 controls 24 to keep the pressure within the laser chamber 1' in the amplification-stage laser 20 constant.

Subsequently, the spectral purity Δλp1 (or Δλ1$_{10\%}$, etc.) of the laser beam emitted out of the oscillation-stage laser 10 is regulated such that Δλp3=A×Δλp1 (or Δλ3$_{10\%}$=A× Δλ1$_{10\%}$, etc.) where A is of the order of 1 to 5. Regulation of the spectral purity is performed by control of the pressure of the gas within the laser chamber 1 in the oscillation-stage laser 10.

To control the gas pressure, the controller 23 first controls the gas unit 24 to increase the gas pressure P1 within the laser chamber 1 in the oscillation-stage laser 10.

When the spectral purity Δλp3' after the change in the gas pressure is lower than the spectral purity Δλp3 before the change in the gas pressure, the controller 23 then controls the gas unit 24 in such a direction that the pressure P1 increases until Δλp3=A×Δλp1.

On the other hand, when the spectral purity Δλp3' after the change in the gas pressure is higher than the spectral purity Δλp3 before the change in the gas pressure, the controller 23 then controls the gas unit 24 in such a direction that the pressure P1 decreases until Δλp3=A×Δλp1.

This procedure may be modified as follows. That is, the controller 23 first controls the gas unit 24 to decrease the gas pressure P1 within the laser chamber 1 in the oscillation-stage laser 10.

When the spectral purity Δλp3' after the change in the gas pressure is higher than the spectral purity Δλp3 before the change in the gas pressure, the controller 23 then controls the gas unit 24 in such a direction that the pressure P1 decreases until Δλp3=A×Δλp1.

On the other hand, when the spectral purity Δλp3' after the change in the gas pressure is higher than the spectral purity Δλp3 before the change in the gas pressure, the controller 23 then controls the gas unit 24 in such a direction that the pressure P1 increases until Δλp3=A×Δλp1.

Finally, reference is made to an embodiment of the invention wherein, when there is a shift of wavelength selection in the line-narrowing unit 2, tuning is carried out by control of the wavelength on the oscillation-stage laser 10 side and the wavelength on the amplification-stage laser 20 side.

In the arrangement of FIG. 5, a part of the laser beam emitted out of the amplification-stage laser 20 where the seed laser beam from the oscillation-stage laser 10 has been amplified is singled out by the beam splitter 17, and then guided to the monitor 22. The monitor 22 detects the spectral waveform of the laser beam emitted out of the amplification-stage laser 20, and then sends data to the controller 23.

The monitor 22 used herein is capable of detecting spectral waveforms.

The controller 23 controls the gas unit 24 to keep the pressure within the laser chamber 1' in the amplification-stage laser 20 constant.

The wavelength of the laser beam emitted out of the oscillation-stage laser 10 is regulated by wavelength tuning by a laser band-narrowing element (grating, etc.) in the line-narrowing unit 2 in the oscillation-stage laser 10 in such a way that the spectral purity Δλ3 of the post-amplification laser beam emitted out of the amplification-stage laser 20 is minimized. This means that the wavelength on the oscillation-stage laser 10 side is matched to the wavelength on the amplification-stage laser 20 side.

When a prism and a diffraction grating are used for wavelength tuning at the line-narrowing unit 2 (see FIG. 17(*a*) and FIG. 18(*a*)), the wavelength tuning is carried out by rotation of the grating. When a reflecting mirror is located as a turn-back mirror in the line-narrowing module comprising the prism and grating, the wavelength tuning is controlled by rotation of that mirror. Alternatively, the center wavelength may be controlled by use of both the turn-back mirror and the grating.

When an etalon is used for the wavelength tuning at the line-narrowing unit 2 (see FIG. 17(*b*) and FIG. 18(*b*)), the wavelength tuning is carried out by rotation of the etalon, and when the etalon is an air gap etalon, the wavelength tuning is performed by rotation of the etalon or varying the pressure of an atmosphere in which the etalon is placed (i.e., varying the refractive index of the atmosphere).

While the present invention has been described with reference to some preferable embodiments of the photolithographic molecular fluorine laser system, it is understood that the invention is in no sense limited thereto, and so could be modified in various manners.

In accordance with the inventive photolithographic molecular fluorine laser system of the two-stage mode comprising an oscillation-stage laser and an amplification-stage laser, which is controlled such that the center wavelength of the oscillation-stage laser is matched to the center wavelength of the amplification-stage laser, the band of the photolithographic molecular fluorine laser system can be made very narrow with satisfactorily improved spectral purity.

What we claim is:

1. A two-stage mode of photolithographic molecular fluorine laser system comprising an oscillation-stage laser and an amplification-stage laser, wherein:

a center wavelength of a laser beam emitted out of the oscillation-stage laser is compared with and substantially matched to a center wavelength of a laser beam emitted out of the amplification-stage laser when said amplification-stage laser is oscillated by itself.

2. The photolithographic molecular fluorine laser system according to claim 1, wherein:

while the center wavelength of the laser beam emitted out of the oscillation-stage laser remains fixed, the center wavelength of the laser beam emitted out of the amplification-stage laser when said amplification-stage laser is oscillated by itself is controlled for tuning in to the center wavelength of the laser beam emitted out of the oscillation-stage laser.

3. The photolithographic molecular fluorine laser system according to claim 2, wherein:

wavelength control for the amplification-stage laser is performed by control of a pressure within a laser chamber in the amplification-stage laser.

4. The photolithographic molecular fluorine laser system according to claim 1, wherein:

while the center wavelength of the laser beam emitted out of the amplification-stage laser when said amplification-stage laser is oscillated by itself remains fixed the center wavelength of the laser beam emitted out of the oscillation-stage laser is controlled for tuning in to the center wavelength of the laser beam emitted out of the amplification-stage laser when said amplification-stage laser is oscillated by itself.

5. The photolithographic molecular fluorine laser system according to claim 4, wherein:

wavelength control for the oscillation-stage laser is performed by control of a pressure within a laser chamber in the oscillation-stage laser.

6. The photolithographic molecular fluorine laser system according to claim 1, wherein:

a target wavelength is predetermined, and both the center wavelength of the laser beam emitted out of the oscillation-stage laser and the center wavelength of the laser beam emitted out of the amplification-stage laser when said amplification-stage laser is oscillated by itself are controlled for tuning in to said target wavelength.

7. The photolithographic molecular fluorine laser system according to claim 6, wherein:

wavelength controls for the oscillation-stage laser and the amplification-stage laser are performed by control pressures in respective laser chambers.

8. The photolithographic molecular fluorine laser system according to claim 1, wherein:

the center wavelength of the laser beam emitted out of the oscillation-stage laser is fixed, a spectral purity of the laser beam emitted out of the amplification-stage laser is measured, and a pressure within a laser chamber in the amplification-stage laser is controlled such that said spectral purity is minimized.

9. The photolithographic molecular fluorine laser system according to claim 1, wherein:

the center wavelength of the laser beam emitted out of the oscillation-stage laser is fixed, a spectral purity of the laser beam emitted out of the oscillation-stage laser is measured, a spectral purity of the laser beam emitted out of the amplification-stage laser is measured, and a pressure within a laser chamber in the amplification-stage laser is controlled such that the spectral purity of the laser beam emitted out of the amplification-stage laser is A times as high as the spectral purity of the laser beam emitted out of the oscillation-stage laser, where A ranges from 1 to 5.

10. The photolithographic molecular fluorine laser system according to claim 1, wherein:

a pressure within a laser chamber in the amplification-stage laser is fixed, a spectral purity of the laser beam emitted out of the amplification-stage laser is measured, a spectral purity of the laser beam emitted out of the oscillation-stage laser is measured, and a pressure within a laser chamber in the oscillation-stage laser is controlled such that the spectral purity of the laser beam emitted out of the amplification-stage laser is A times as high as the spectral purity of the laser beam emitted out of the oscillation-stage laser, where A ranges from 1 to 3.

11. The photolithographic molecular fluorine laser system according to claim 8 or 10, wherein the spectral purity is a spectral 10% linewidth.

12. The photolithographic molecular fluorine laser system according to claim 1, wherein:

the center wavelength of the laser beam emitted out of the oscillation-stage laser is fixed, an ideal purity for the laser beam emitted out of the amplification-stage laser is set, a spectral purity of the laser beam emitted out of the amplification-stage laser is measured, and a pressure within a laser chamber in the amplification-stage laser is controlled such that the spectral purity of the laser beam emitted out of the amplification-stage laser is substantially the same as the ideal spectral purity.

13. The photolithographic molecular fluorine laser system according to any one of claims 8 to 12, wherein the spectral purity is a 95% purity.

14. The photolithographic molecular fluorine laser system according to claim 1, wherein:

the center wavelength of the laser beam emitted out of the oscillation-stage laser is fixed, spectral purities of the laser beam emitted out of the oscillation-stage laser on a shorter wavelength side and a longer wavelength side with respect to the center wavelength thereof are measured and a ratio of both is determined by calculation, spectral purities of the laser beam emitted out of the amplification-stage laser on a shorter wavelength side and a longer wavelength side with respect to the center wavelength thereof are measured and a ratio of both is determined by calculation, and a pressure within a laser chamber in the amplification-stage laser is controlled such that said ratio of the laser beam emitted out of the amplification-stage laser is substantially the same as said ratio of the laser beam emitted out of the oscillation-stage laser.

* * * * *